(12) United States Patent
Chou et al.

(10) Patent No.: US 10,128,113 B2
(45) Date of Patent: Nov. 13, 2018

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventors: Shih-Pei Chou, Tainan (TW); Chen-Fa Lu, Kaohsiung (TW); Jiech-Fun Lu, Tainan County (TW); Yeur-Luen Tu, Taichung (TW); Chia-Shiung Tsai, Hsin-Chu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/993,468

(22) Filed: Jan. 12, 2016

(65) Prior Publication Data

US 2017/0200640 A1 Jul. 13, 2017

(51) Int. Cl.
| | |
|---|---|
| *H01L 21/033* | (2006.01) |
| *H01L 21/762* | (2006.01) |
| *H01L 21/32* | (2006.01) |
| *H01L 21/768* | (2006.01) |
| *H01L 23/48* | (2006.01) |

(52) U.S. Cl.
CPC .......... *H01L 21/0332* (2013.01); *H01L 21/32* (2013.01); *H01L 21/76224* (2013.01); *H01L 21/76898* (2013.01); *H01L 23/481* (2013.01); *H01L 21/76807* (2013.01)

(58) Field of Classification Search
CPC . H01L 27/092; H01L 23/481; H01L 21/0332; H01L 21/76898; H01L 21/76224; H01L 21/32; H01L 21/76807
USPC .......................... 438/124, 234, 207; 257/775
See application file for complete search history.

(56) References Cited

U.S. PATENT DOCUMENTS

| | | | |
|---|---|---|---|
| 2005/0020003 A1* | 1/2005 | Johansson | H01L 21/8249 438/207 |
| 2008/0048215 A1* | 2/2008 | Davies | H01L 27/0262 257/274 |
| 2012/0100680 A1* | 4/2012 | Chuang | H01L 21/26593 438/234 |
| 2015/0115397 A1* | 4/2015 | Cheng | H01L 29/0649 257/510 |

* cited by examiner

*Primary Examiner* — Bo Fan
(74) *Attorney, Agent, or Firm* — WPAT, P.C., Intellectual Property Attorneys; Anthony King

(57) ABSTRACT

A semiconductor structure comprises a substrate comprising an interlayer dielectric (ILD) and a silicon layer disposed over the ILD, wherein the ILD comprises a conductive structure disposed therein, a dielectric layer disposed over the silicon layer, and a conductive plug electrically connected with the conductive structure and extended from the dielectric layer through the silicon layer to the ILD, wherein the conductive plug has a length running from the dielectric layer to the ILD and a width substantially consistent along the length.

20 Claims, 22 Drawing Sheets

SEMICONDUCTOR STRUCTURE AND MANUFACTURING METHOD THEREOF

BACKGROUND

Electronic equipment using semiconductor devices are essential for many modern applications. With the advancement of electronic technology, semiconductor devices are becoming increasingly smaller in size while having greater functionality and greater amounts of integrated circuitry. Due to the miniaturized scale of the semiconductor device, wafer level packaging (WLP) is widely used because of its low cost and relatively simple manufacturing operations. During the WLP operation, a number of semiconductor components are assembled on the semiconductor device. Furthermore, numerous manufacturing operations are implemented within such a small semiconductor device.

Technological advances in materials and design have produced generations of semiconductor device where each generation has smaller and more complex circuits than the previous generation. In the course of advancement and innovation, functional density (i.e., the number of interconnected devices per chip area) has generally increased while geometric size (i.e., the smallest component that can be created using a fabrication process) has decreased. The manufacturing operations of the semiconductor device involve many steps and operations on such a small and thin semiconductor device. Such advances have increased the complexity of processing and manufacturing semiconductor devices. A decrease of the geometric size of the semiconductor device may cause deficiencies such as poor electrical interconnection, inaccurate placement of components or other issues, which results in a high yield loss of the semiconductor device. The semiconductor device is produced in an undesired configuration, which further wastes materials and thus increases the manufacturing cost.

The semiconductor device is assembled with a number of integrated components, while the geometric size of the semiconductor device becomes smaller and smaller. As such, there are many challenges for modifying a structure of the semiconductor devices and improving the manufacturing operations.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
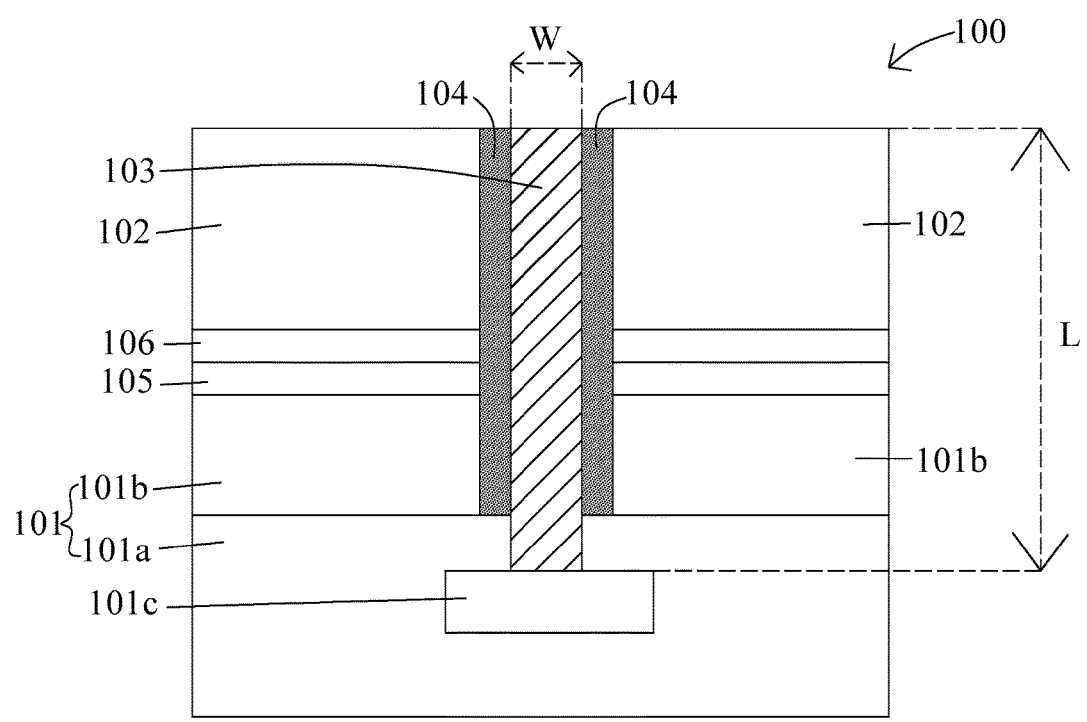
FIG. 1 is a schematic cross-sectional view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor structure is manufactured by a number of operations. During the manufacturing, several insulating layers are stacked over a substrate or wafer, and several conductive structures are formed within the insulating layers or the substrate. An electrical interconnect structure is formed between these conductive structures across the insulating layers or the substrate of the semiconductor structure. The conductive structures are connected with each other by piercing a number of trenches or vias extending through the insulating layers or the substrate. The trench is then filled with a conductive material, so that the conductive structures are electrically connected by the conductive material filling the trenches.

Since a geometric size of the semiconductor structure continues to become smaller and smaller, a size of the trench has to be further shrunken. However, the size of the trench is limited by several factors such as a resolution of etching operations, selectivity of a material being etched, or other factors. As such, it may be difficult to further reduce the geometric size of the semiconductor structure. Furthermore, formation of the trench involves several etching operations. The trench is etched in a manner of portion by portion, which involves a high manufacturing cost and burdensome effort.

In the present disclosure, an improved semiconductor structure is disclosed. The semiconductor structure includes a substrate with a silicon layer thereon, a dielectric layer disposed over the silicon layer, and a conductive plug extending from the dielectric layer through the silicon layer of the substrate. The conductive plug has a substantially consistent width along its length from the dielectric layer to the substrate. Further, the width of the conductive plug can be decreased and an aspect ratio of the length to the width of the conductive plug can be increased. Such configuration of the conductive plug can facilitate a reduction of a geometric size of the semiconductor structure.

FIG. 1 is a schematic cross-sectional view of a semiconductor structure 100 in accordance with various embodiments of the present disclosure. In some embodiments, the semiconductor structure 100 includes a substrate 101, a dielectric layer 102 and a conductive plug 103. In some embodiments, the semiconductor structure 100 is a part of a semiconductor device or a semiconductor package.

In some embodiments, the substrate 101 a piece including semiconductive material such as silicon, germanium, gallium arsenic or etc. In some embodiments, the substrate 101 is a silicon substrate. In some embodiments, the substrate 101 further includes doped regions such as P-well, an N-well, or etc. In some embodiments, the substrate 101 is fabricated with a predetermined functional circuit over the substrate 101 produced by various methods such as photolithography operations, etching or etc.

In some embodiments, the substrate 101 is a wafer including semiconductive material such as silicon. In some embodiments, the substrate 101 is a logic device wafer. In some embodiments, the first substrate 101 is in a circular, quadrilateral or polygonal shape. In some embodiments, active devices (not shown) such as transistors are formed over or within the substrate 101. In some embodiments, the substrate 101 comprises any one of various known types of semiconductor devices such as memories (such as SRAMS, flash memories, etc.), application-specific integrated circuits (ASICs), or the like.

In some embodiments, the substrate 101 includes an interlayer dielectric (ILD) 101a and a silicon layer 101b disposed over the ILD 101a. In some embodiments, the silicon layer 101b is disposed conformal to a surface of the ILD 101a. In some embodiments, the ILD 101a includes dielectric material such as silicon oxide, silicon carbide, silicon oxynitride, silicon nitride or the like. In some embodiments, the ILD 101a includes dielectric material such as polymer, polybenzoxazole (PBO), polyimide, benzocyclobutene (BCB), or the like. In some embodiments, the ILD 101a is a single layer or more than one layer of dielectric material disposed over each other. For clarity and simplicity, FIG. 1 illustrates a piece of ILD 101a. However, a person of ordinary skill in the art would readily understand that one or more layers of dielectric material can be present in the ILD 101a.

In some embodiments, the ILD 101a includes a conductive structure 101c disposed therein. In some embodiments, the conductive structure 101c is surrounded by one or more layers of dielectric material in the ILD 101a. In some embodiments, the conductive structure 101c is insulated by the dielectric material in the ILD 101a. In some embodiments, the conductive structure 101c is configured to electrically connect with a conductive line or a circuitry external to the substrate 101. In some embodiments, the conductive structure 101c includes conductive material such as copper, gold, aluminum, nickel, tungsten, palladium, etc. In some embodiments, the conductive structure 101c is a top metal of the substrate 101.

In some embodiments, one or more conductive structures 101c are disposed within the ILD 101a and surrounded by one or more layers of dielectric material in the ILD 101a. For clarity and simplicity, FIG. 1 illustrates only one conductive structure 101c in the ILD 101a of the substrate 101. However, a person of ordinary skill in the art would readily understand that several conductive structures 101c can be present in the ILD 101a. In some embodiments, the conductive structures 101c are isolated from each other by the dielectric material in the ILD 101a.

In some embodiments, an isolation (105, 106) is disposed over substrate 101. In some embodiments, the isolation (105, 106) is disposed over the silicon layer 101b. In some embodiments, the isolation (105, 106) includes a high dielectric constant (high-k) dielectric 105 and a nitride 106. In some embodiments, the high-k dielectric 105 is disposed over the silicon layer 101b. In some embodiments, the high-k dielectric 105 includes hafnium dioxide (HfO2), zirconium dioxide (ZrO2), titanium dioxide (TiO2), or etc. In some embodiments, the nitride 106 is disposed over the high-k dielectric 105. In some embodiments, the nitride 106 includes silicon nitride or the like.

In some embodiments, a dielectric layer 102 is disposed over the substrate 101. In some embodiments, the dielectric layer 102 is disposed over the silicon layer 101b. In some embodiments, the dielectric layer 102 is disposed over the nitride 106. In some embodiments, the dielectric layer 102 includes undoped silica glass (USG). In some embodiments, the dielectric layer 102 includes a single layer or more than one layer of dielectric material disposed over each other. In some embodiments, the layers of dielectric material are isolated from each other by the isolation such as the nitride 106. For clarity and simplicity, FIG. 1 illustrates one dielectric layer 102. However, a person of ordinary skill in the art would readily understand that one or more layers of the dielectric layer 102 can be present.

In some embodiments, a conductive plug 103 is disposed within the substrate 101 and the dielectric layer 102. In some embodiments, the conductive plug 103 is surrounded by the dielectric layer 102, the silicon layer 101b and the ILD 101a. In some embodiments, the conductive plug 103 is electrically connected with the conductive structure 101c in the ILD 101a. In some embodiments, the conductive plug 103 is coupled with the conductive structure 101c. In some embodiments, the conductive plug 103 is interfaced with the conductive structure 101c. In some embodiments, the conductive plug 103 includes conductive material such as copper, gold, aluminum, nickel, tungsten, palladium, etc.

In some embodiments, the conductive plug 103 is extended from the dielectric layer 102 through the silicon layer 101b to the ILD 101a. In some embodiments, the conductive plug 103 is extended through the dielectric layer 102, the silicon layer 101b and a portion of the ILD 101a. In some embodiments, the conductive plug 103 passes through the dielectric layer 102, the nitride 106, the high-k dielectric 105, the silicon layer 101b and the portion of the ILD 101a. In some embodiments, the conductive plug 103 is in a cylindrical shape. In some embodiments, the conductive plug 103 is a through silicon via (TSV).

In some embodiments, the conductive plug 103 has a length L and a width W. In some embodiments, the length L of the conductive plug 103 is a distance running from the dielectric layer 102 to the ILD 101a. In some embodiments, the length L is a height of the conductive plug 103. In some embodiments, the length L is a longest dimension of the conductive plug 103. In some embodiments, the length L runs from a top surface of the dielectric layer 102 to a top surface of the conductive structure 101c. In some embodiments, the length L is a depth of the conductive plug 103 across the dielectric layer 102, the isolation (105, 106), the silicon layer 101b and the ILD 101a. In some embodiments, the length L of the conductive plug 103 is from about 1 um to about 10 um. In some embodiments, the length L is from about 2 um to about 8 um. In some embodiments, the length L is substantially greater than 3 um.

In some embodiments, the width W of the conductive plug 103 is a distance substantially orthogonal to the length L. In some embodiments, the width W is a shortest dimension of the conductive plug 103. In some embodiments, the width W of the conductive plug 103 is from about 0.1 um to about 0.5 um. In some embodiments, the width W of the conductive plug 103 is from about 0.2 um to about 0.4 um. In some embodiments, the width W is substantially less than 0.5 um.

In some embodiments, the width W of the conductive plug 103 is substantially consistent along the length L of the conductive plug 103. In some embodiments, the width W of the conductive plug 103 surrounded by the dielectric layer 102 is substantially the same as the width W of the conductive plug 103 surrounded by the silicon layer 101b. In some embodiments, the width W of the conductive plug 103 surrounded by the silicon layer 101b is substantially the same as the width W of the conductive plug 103 surrounded by the ILD 101a. In some embodiments, the width W of the conductive plug 103 surrounded by the dielectric layer 102 is substantially the same as the width W of the conductive plug 103 surrounded by the ILD 101a. In some embodiments, the width W of the conductive plug 103 surrounded by the nitride 106 is substantially the same as the width W of the conductive plug 103 surrounded by the dielectric layer 102, the silicon layer 101b or the ILD 101a.

In some embodiments, the conductive plug 103 has an aspect ratio of the length L to the width W. In some embodiments, the aspect ratio of the conductive plug 103 is substantially greater than 20. In some embodiments, the aspect ratio of the conductive plug 103 is substantially greater than 30. In some embodiments, the length L of the conductive plug 103 is substantially greater than the width W of the conductive plug 103.

In some embodiments, an isolation layer 104 is disposed around the conductive plug 103. In some embodiments, the conductive plug 103 is surrounded by the isolation layer 104. In some embodiments, the conductive plug 103 is insulated from the dielectric layer 102 and the silicon layer 101b by the isolation layer 104. In some embodiments, the isolation layer 104 is extended from the dielectric layer 102 to the silicon layer 101b or the ILD 101a. In some embodiments, the isolation layer 104 is conformal to an outer surface of the conductive plug 103. In some embodiments, the isolation layer 104 is protruded into the ILD 101a. In some embodiments, the conductive plug 103 is protruded from the isolation layer 104 towards the conductive structure 101c. In some embodiments, the isolation layer 104 includes nitride, silicon nitride or the like.

Figure 2:
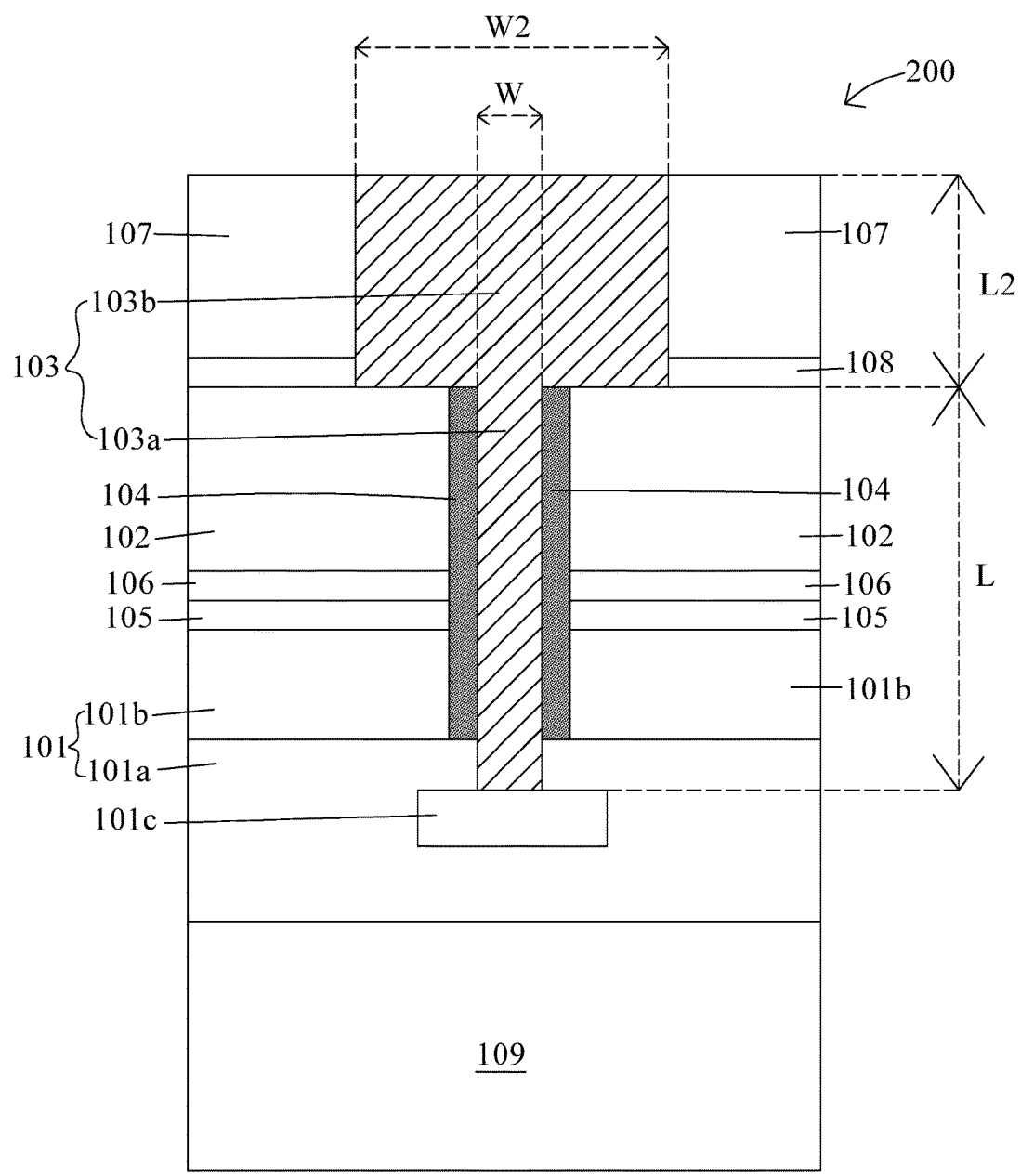
FIG. 2 is a schematic cross-sectional view of a semiconductor structure in accordance with some embodiments of the present disclosure.

FIG. 2 is a schematic cross-sectional view of a semiconductor structure 200 in accordance with various embodiments of the present disclosure. In some embodiments, the semiconductor structure 200 includes a first substrate 101, an ILD 101a, a silicon layer 101b, a conductive structure 101c, a second substrate 109, a high-k dielectric 105, a first nitride 106, a first dielectric layer 102, a second dielectric layer 107, a second nitride 108, a conductive plug 103 and an isolation layer 104. In some embodiments, the first substrate 101, the ILD 101a, the silicon layer 101b, the conductive structure 101c, the high-k dielectric 105, the first nitride 106, the first dielectric layer 102 and the isolation layer 104 have similar configuration as the substrate 101, the ILD 101a, the silicon layer 101b, the conductive structure 101c, the high-k dielectric 105, the nitride 106, the dielectric layer 102 and the isolation layer 104 respectively described above or illustrated in FIG. 1. In some embodiments, the semiconductor structure 200 is a part of a semiconductor device or a semiconductor package.

In some embodiments, the semiconductor structure 200 includes the second substrate 109 bonded with the first substrate 101. In some embodiments, the second substrate 109 is bonded with the ILD 101a of the first substrate 101. In some embodiments, the first substrate 101 is bonded over the second substrate 109. In some embodiments, the second substrate 109 includes semiconductive material such as silicon, germanium, gallium arsenic or etc. In some embodiments, the second substrate 109 is a silicon substrate. In some embodiments, the second substrate 109 is fabricated with a predetermined functional circuit over the substrate 101 produced by various methods such as photolithography operations, etching or etc. In some embodiments, the second substrate 109 is a wafer including semiconductive material such as silicon. In some embodiments, the second substrate 109 is a logic device wafer. In some embodiments, the second substrate 109 is in a circular, quadrilateral or polygonal shape. In some embodiments, the second substrate 109 has similar configuration as the first substrate 101.

In some embodiments, the second substrate 109 includes one or more layers of dielectric material surrounding one or more conductive members. In some embodiments, the second substrate 109 includes a semiconductive layer disposed over the dielectric material. In some embodiments, the dielectric material of the second substrate 109 includes silicon oxide, silicon carbide, silicon oxynitride, silicon nitride or the like. In some embodiments, the semiconductive layer of the second substrate 109 includes silicon or the like. In some embodiments, the dielectric material of the second substrate 109 is bonded with the ILD 101a of the first substrate 101.

In some embodiments, the second nitride 108 is disposed over the first dielectric layer 102. In some embodiments, the second nitride 108 is disposed conformal to a surface of the first dielectric layer 102. In some embodiments, the second nitride 108 includes silicon nitride or the like. In some embodiments, the second nitride 108 has similar configuration as the first nitride 106. In some embodiments, the second nitride 108 includes the same material as or different material from the first nitride 106.

In some embodiments, the second dielectric layer 107 is disposed over the first dielectric layer 102. In some embodiments, the second dielectric layer 107 is disposed over the second nitride 108. In some embodiments, the second dielectric layer 107 includes undoped silica glass (USG). In some embodiments, the second dielectric layer 107 includes a single layer or more than one layer of dielectric material disposed over each other. In some embodiments, the second dielectric layer 107 has similar configuration as the first dielectric layer 102. In some embodiments, the second dielectric layer 107 includes the same material as or different material from the first dielectric layer 102.

In some embodiments, the conductive plug 103 includes a first portion 103a and a second portion 103b. In some embodiments, the first portion 103a is extended from the first dielectric layer 102 through the silicon layer 101b to the ILD 101a. In some embodiments, the first portion 103a is coupled with the conductive structure 101c in the ILD 101a. In some embodiments, the first portion 103a has a length L running from the first dielectric layer 102 to the ILD 101a. In some embodiments, the first portion 103a has a width W substantially consistent along the length L. In some embodiments, the length L of the first portion 103a is from about 1 um to about 10 um. In some embodiments, the width W of the first portion 103a is from about 0.1 um to about 0.5 um. In some embodiments, the first portion 103a has an aspect ratio of the length L to the width W. In some embodiments, the aspect ratio of the first portion 103a is substantially greater than about 20. In some embodiments, the first portion 103a has similar configuration as the conductive plug 103 described above or illustrated in FIG. 1.

In some embodiments, the second portion 103b of the conductive plug 103 is extended through the second dielectric layer 107. In some embodiments, the second portion 103b of the conductive plug 103 is extended through the second nitride 108. In some embodiments, the second portion 103b is protruded into a portion of the first dielectric layer 102. In some embodiments, the second portion 103b is surrounded by the second dielectric layer 107, the second nitride 108 and the first dielectric layer 102. In some embodiments, the second portion 103b is configured to receive other conductive member such as a pad. In some embodiments, a die pad or a bond pad is disposed over the second portion 103b of the conductive plug 103.

In some embodiments, the second portion 103b is disposed over the first portion 103a. In some embodiments, the first portion 103a is integral with the second portion 103b. In some embodiments, the first portion 103a includes same material as the second portion 103b. In some embodiments, the first portion 103a and the second portion 103b includes conductive material such as copper, gold, aluminum, nickel, tungsten, palladium, etc.

In some embodiments, the second portion 103b has a width W2 which is substantially greater than the width W of the first portion 103a. In some embodiments, the width W2 is from about 1 um to about 3 um. In some embodiments, the width W2 is from about 1 um to about 1.5 um. In some embodiments, the second portion 103b has a length L2 which is substantially smaller than the length L of the first portion 103a. In some embodiments, the second portion 103b has an aspect ratio of the length L2 to the width W2. In some embodiments, the aspect ratio of the second portion 103b is substantially smaller than the aspect ratio of the first portion 103a.

In the present disclosure, a method of manufacturing a semiconductor structure is also disclosed. In some embodiments, a semiconductor structure 100 is formed by a method 300. The method 300 includes a number of operations and the description and illustration are not deemed as a limitation as the sequence of the operations. The method 300 includes a number of operations (301, 302, 303, 304 and 305).

Figure 3:
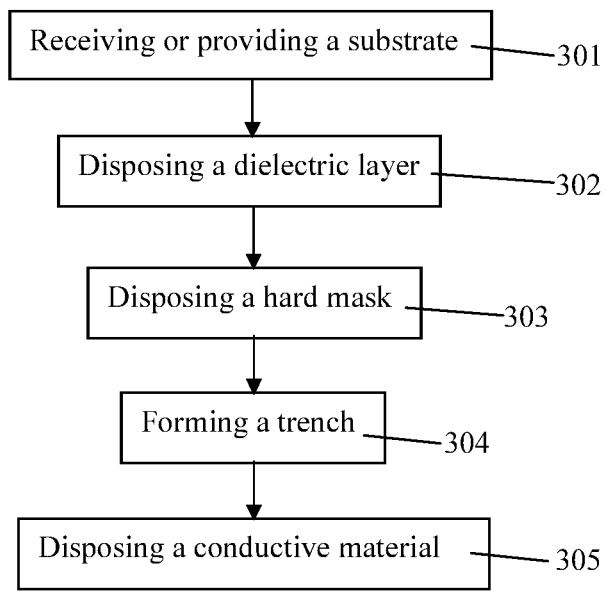
FIG. 3 is a flow diagram of a method of manufacturing a semiconductor structure in accordance with some embodiments of the present disclosure.
Figure 3A:
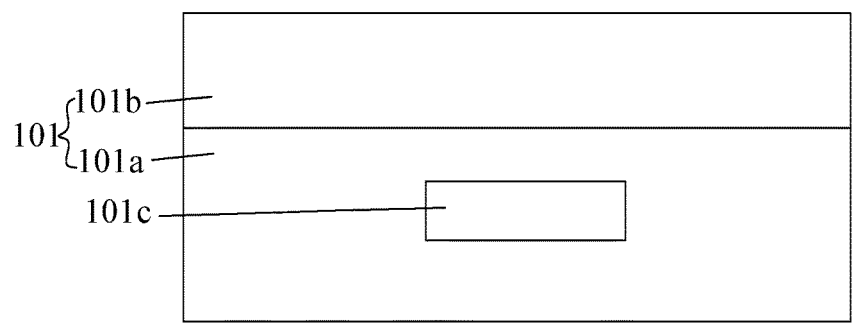
FIGS. 3A-3L are schematic views of manufacturing a semiconductor structure by a method of FIG. 3 in accordance with some embodiments of the present disclosure.

In operation 301, a substrate 101 is received or provided as shown in FIG. 3A. In some embodiments, the substrate 101 includes an ILD 101a and a silicon layer 101b disposed over the ILD 101a. In some embodiments, a conductive structure 101c is disposed within the ILD 101a. In some embodiments, the substrate 101, the ILD 101a, the silicon layer 101b and the conductive structure 101c have similar configuration as described above or illustrated in FIG. 1.

Figure 3B:
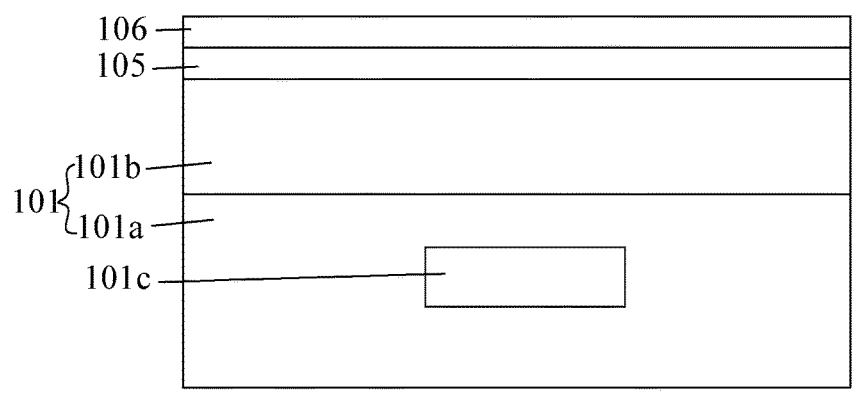

In some embodiments, an isolation (105, 106) is disposed over the substrate 101 as shown in FIG. 3B. In some embodiments, the isolation 105 includes a high-k dielectric 105 and a nitride 106. In some embodiments, the nitride 106 is disposed over the high-k dielectric 105. In some embodiments, the high-k dielectric 105 or the nitride 106 is formed by spin coating, lamination, chemical vapor deposition (CVD) or the like. In some embodiments, the high-k dielectric 105 and the nitride 106 have similar configuration as described above or illustrated in FIG. 1.

Figure 3C:
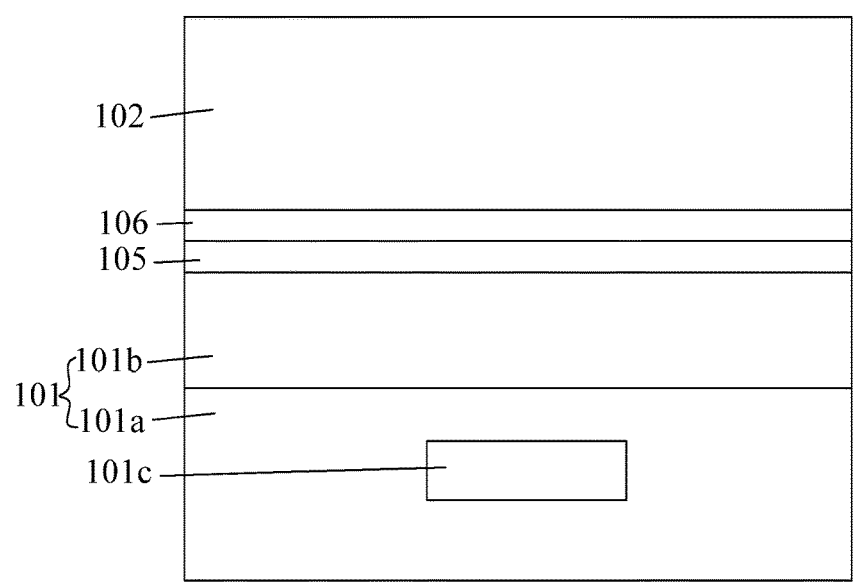

In operation 302, a dielectric layer 102 is disposed over the substrate 101 as shown in FIG. 3C. In some embodiments, the dielectric layer 102 is disposed over the silicon layer 101b. In some embodiments, the dielectric layer 102 is disposed by spin coating, lamination, chemical vapor deposition (CVD) or any other suitable operations. In some embodiments, the dielectric layer 102 has similar configuration as described above or illustrated in FIG. 1.

Figure 3D:
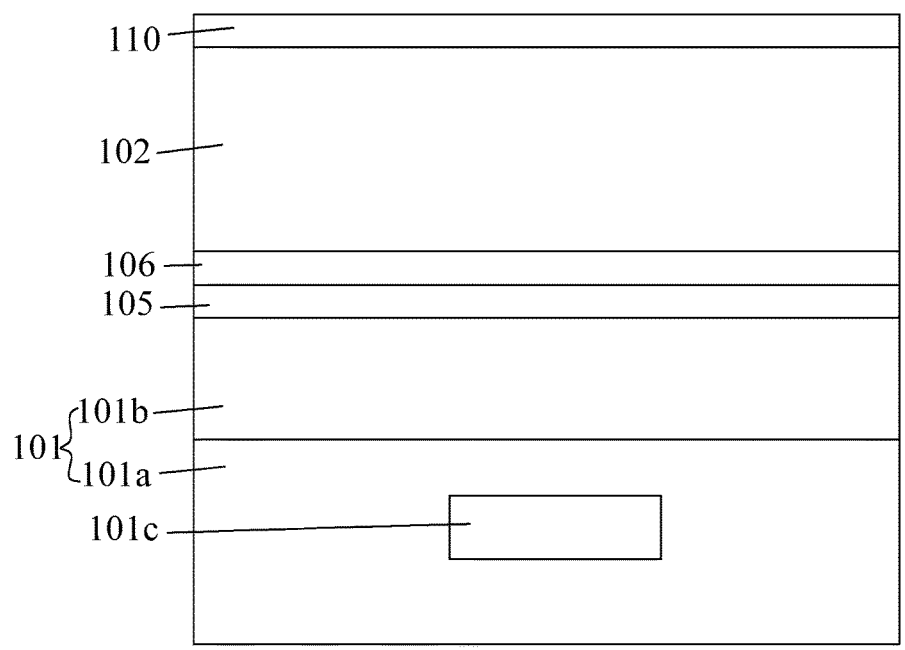

In operation 303, a hard mask 110 is disposed over the dielectric layer 102 as shown in FIG. 3D. In some embodiments, the hard mask 110 includes oxide or the like. In some embodiments, the hard mask 110 is disposed by spin coating, CVD, plasma enhanced chemical vapor deposition (PECVD) or any other suitable operations. In some embodiments, the hard mask 110 is patterned in order to expose a portion of the dielectric layer 102.

Figure 3E:
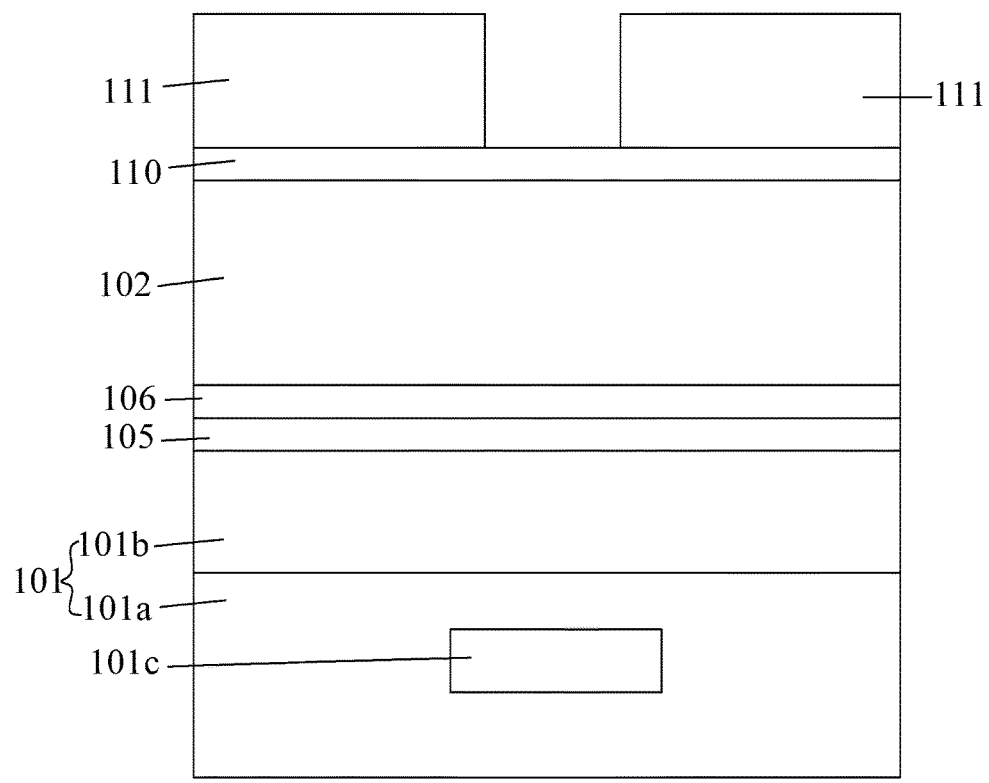

In some embodiments, a photoresist 111 is disposed over the hard mask 110 as shown in FIG. 3E. In some embodiments, the photoresist 111 is disposed by spin coating or other suitable operations. In some embodiments, the photoresist 111 is a light sensitive material with chemical properties depending on an exposure of light. In some embodiments, the photoresist 111 is sensitive to an electromagnetic radiation such as an ultra violet (UV) light, that the chemical properties of the photoresist 111 are changed upon exposure to the UV light. In some embodiments, the photoresist 111 is a positive photoresist. The positive photoresist exposed to the UV light is dissolvable by a developer solution, while the positive photoresist unexposed to the UV light is not dissolvable by the developer solution. In some embodiments, the photoresist 111 is patterned by removing a predetermined portion of the photoresist 111 which corresponds to a position of the portion of the dielectric layer 102, such that a predetermined portion of the hard mask 110 (which also corresponds to the position of the portion of the dielectric layer 102) is exposed from the photoresist 111.

Figure 3F:
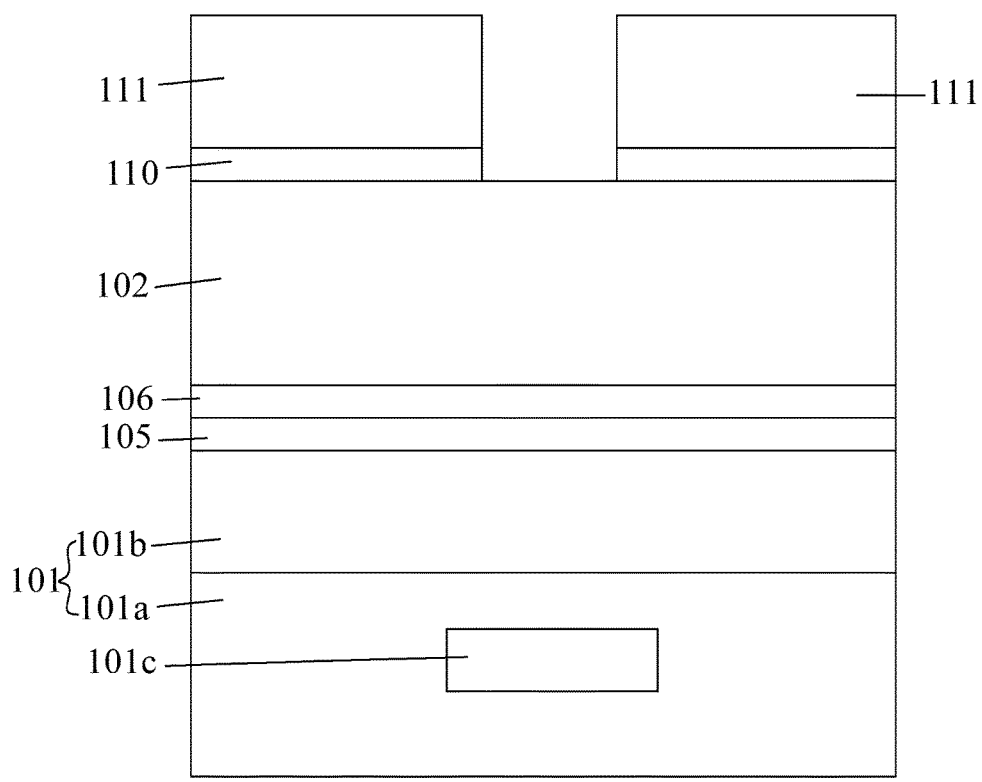
Figure 3G:
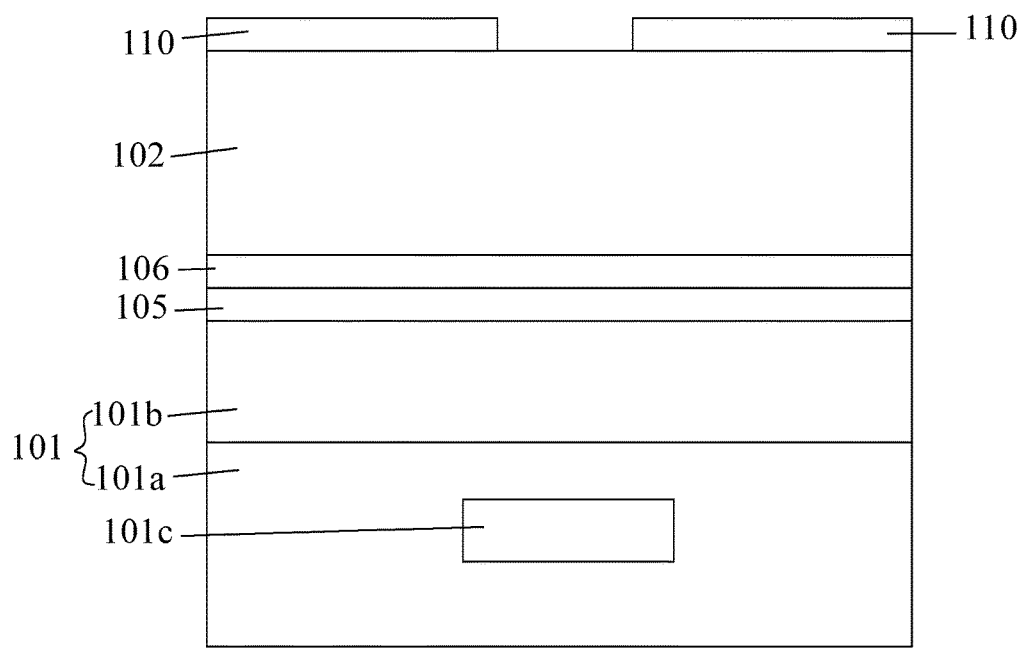

After the patterning of the photoresist 111, the predetermined portion of the hard mask 110 exposed from the photoresist 111 is removed as shown in FIG. 3F. In some embodiments, the portion of the hard mask 110 is removed by any suitable operations such as etching. In some embodiments, the portion of the dielectric layer 102 is exposed from the photoresist 111 and the hard mask 110. In some embodiments, the photoresist 111 is removed from the hard mask 110 as shown in FIG. 3G after the hard mask 110 is patterned. In some embodiments, the photoresist 111 is removed by stripping or any suitable operations. In some embodiments, the hard mask 110 is patterned such that the portion of the dielectric layer 102 is exposed from the hard mask 110.

Figure 3H:
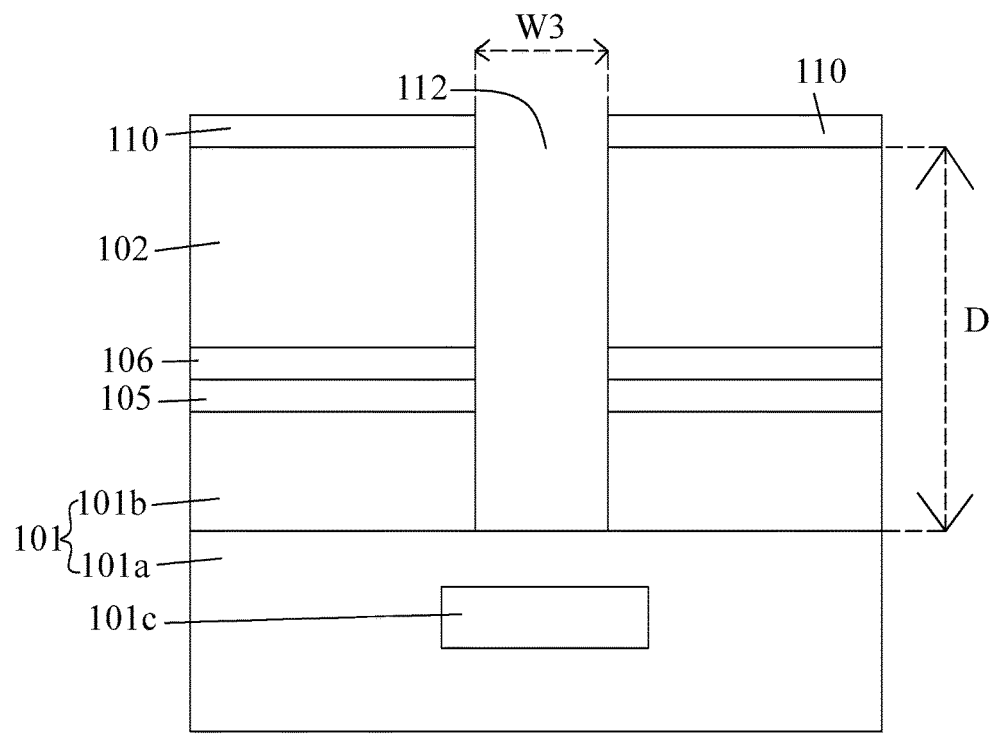

In operation 304, a trench 112 is formed as shown in FIG. 3H. In some embodiments, the trench 112 is extended from the portion of the dielectric layer 102 exposed from the hard mask 110 to the ILD 101a. In some embodiments, the trench 112 is extended through the dielectric layer 102 and the silicon layer 101b. In some embodiments, the trench 112 is extended through the dielectric layer 102, the nitride 106, the high-k dielectric 105, the silicon layer 101b and a portion of the ILD 101a. In some embodiments, the trench 112 is formed by removing the dielectric layer 102 and the silicon layer 101b which are covered by the portion of the dielectric layer 102 exposed from the hard mask 110. In some embodiments, a portion of the ILD 101a covered by the portion of the dielectric layer 102 exposed from the hard mask 110 is also removed. In some embodiments, the trench 112 is formed by any suitable operations such as etching.

In some embodiments, the trench 112 has a depth D running from the dielectric layer 102 to the ILD 101a. In some embodiments, the depth D is from about 1 um to about 10 um. In some embodiments, the trench 112 has a width W3 which is a width of an opening of the trench 112. In some embodiments, the width W3 is from about 0.1 um to about 0.5 um. In some embodiments, the trench 112 has an aspect ratio of the depth D to the width W3. In some embodiments, the aspect ratio of the trench 112 is substantially greater than 30. In some embodiments, the trench 112 has the width W3 substantially consistent along the depth D.

Figure 3I:
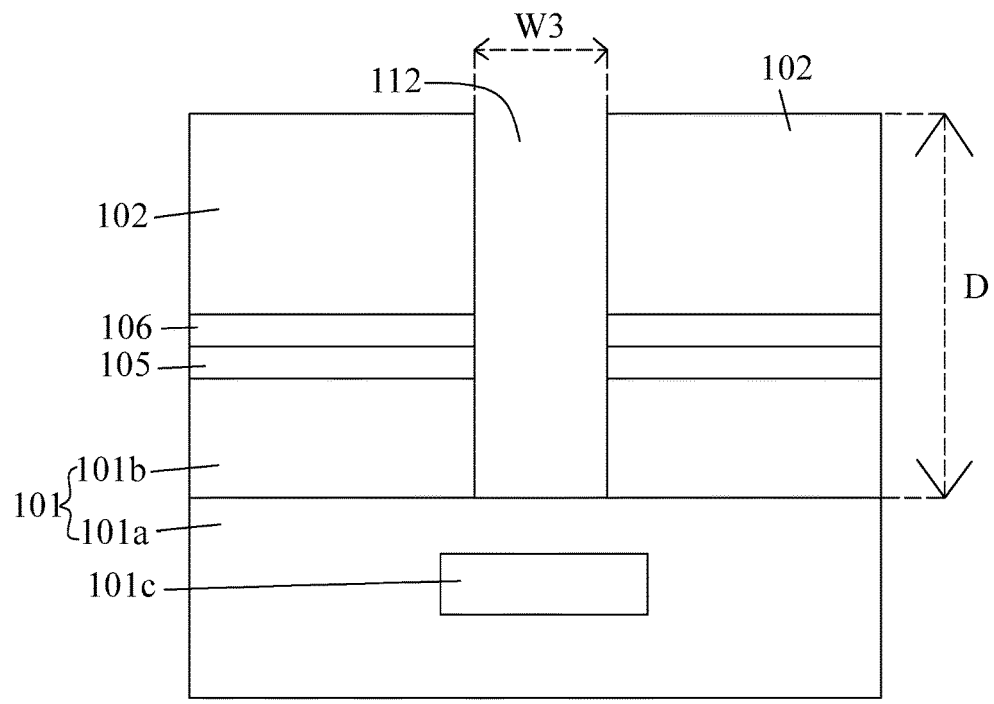

In some embodiments, the hard mask 110 is removed as shown in FIG. 3I. In some embodiments, the hard mask 110 is removed after the formation of the trench 112. In some embodiments, the hard mask 110 is removed from the dielectric layer 102 by any suitable operations such as ashing.

Figure 3J:
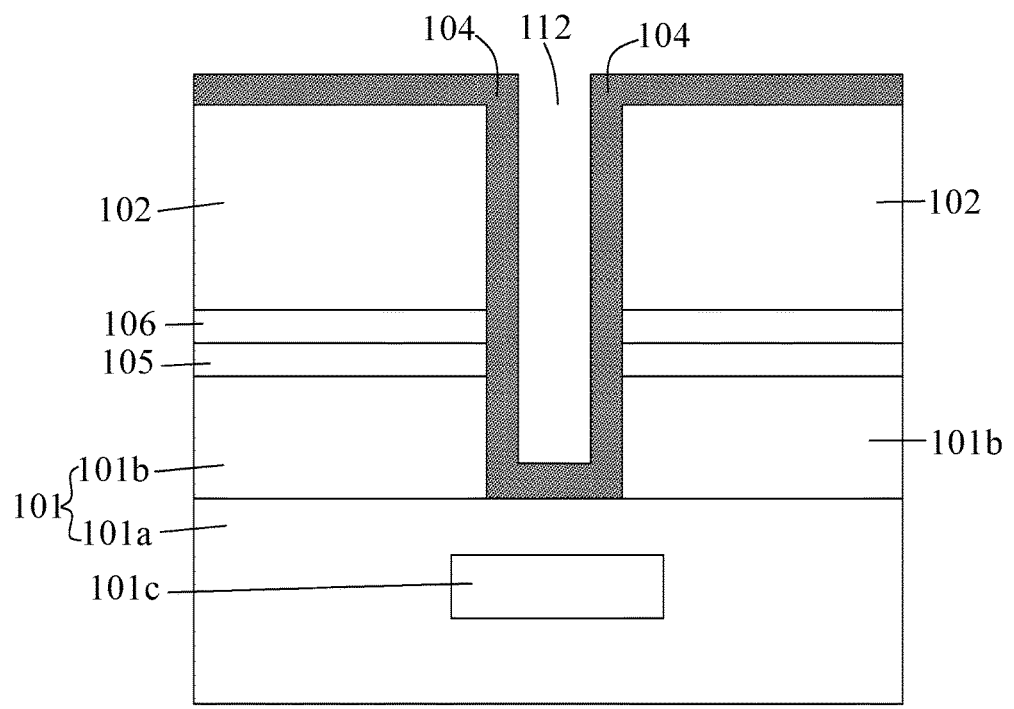

In some embodiments, an isolation layer 104 is disposed over the dielectric layer 102 and along the trench 112 as shown in FIG. 3J. In some embodiments, the isolation layer 104 is disposed conformal to a sidewall of the trench 112. In some embodiments, the isolation layer 104 is surrounded by the dielectric layer 102 and the silicon layer 101b. In some embodiments, the isolation layer 104 is surrounded by the ILD 101a. In some embodiments, the isolation layer 104 is disposed by any suitable operations such as spin coating, CVD, or etc. In some embodiments, the isolation layer 104 includes nitride, silicon nitride or the like.

Figure 3K:
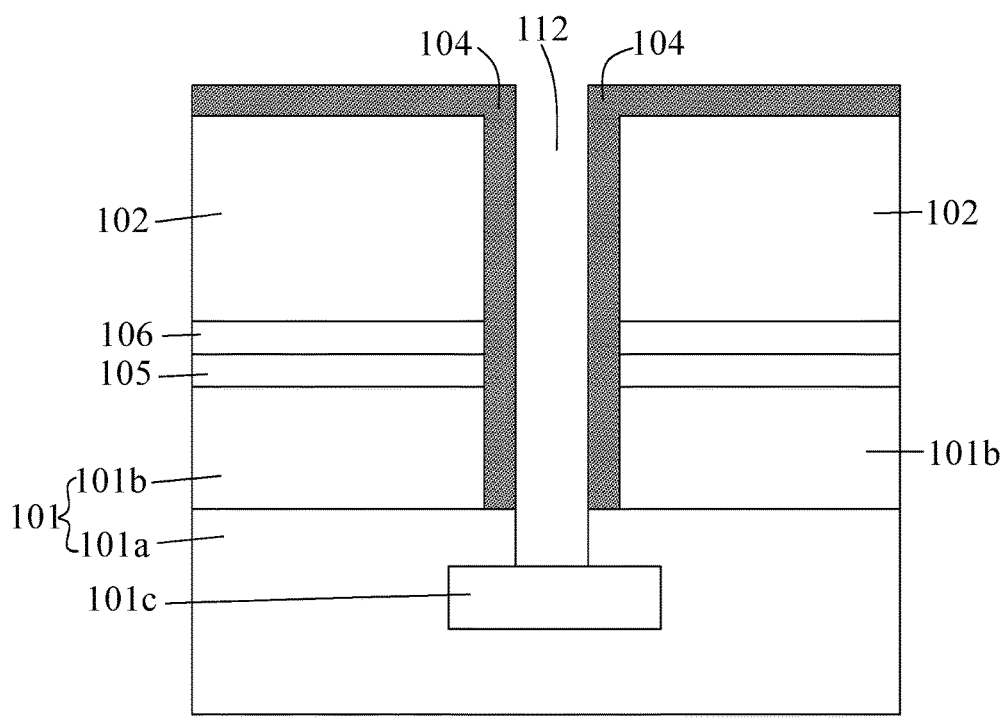

In some embodiments, a portion of the isolation layer 104 disposed over or within the ILD 101a is removed to expose a portion of the ILD 101a as shown in FIG. 3K. In some embodiments, the portion of the ILD 101a exposed from the isolation layer 104 is removed to expose a portion of the conductive structure 101c in the ILD 101a. In some embodiments, the portion of the ILD 101a disposed over the conductive structure 101c is removed. In some embodiments, the portion of the ILD 101a is removed by any suitable operations such as photolithography and etching. In some embodiments, the isolation layer 104 has similar configuration as described above or illustrated in FIG. 1.

Figure 3L:
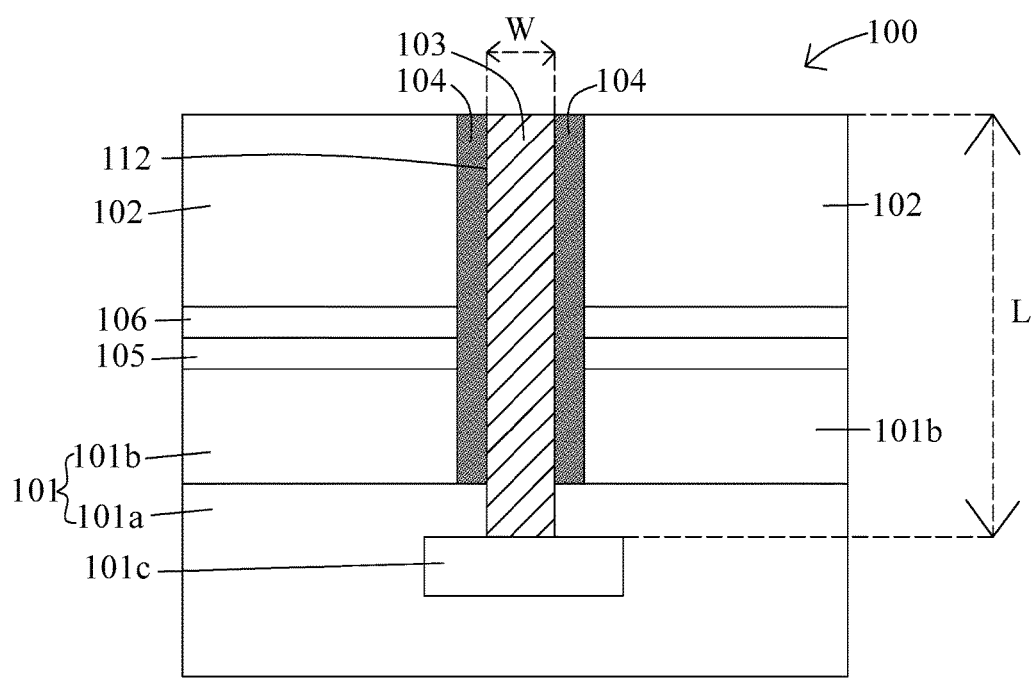

In operation 305, a conductive material is disposed into the trench 112 to form a conductive plug 103 as shown in FIG. 3L. In some embodiments, the conductive plug 103 is extended from the dielectric layer 102 through the silicon layer 101b to the ILD 101a. In some embodiments, the conductive plug 103 is surrounded by the dielectric layer 102, the silicon layer 101b and the ILD 101a. In some embodiments, the conductive plug 103 is disposed within the trench 112. In some embodiments, the conductive plug 103 is electrically connected with the conductive structure 101c in the ILD 101a. In some embodiments, the isolation layer 104 disposed over the dielectric layer 102 is removed. In some embodiments, the conductive material or the conductive plug 103 includes conductive material such as copper, gold, aluminum, nickel, tungsten, palladium, etc.

In some embodiments, the conductive plug 103 has a length L and a width W. In some embodiments, the length L of the conductive plug 103 runs from the dielectric layer 102 to the ILD 101a. In some embodiments, the width W of the conductive plug 103 is substantially consistent along the length L. In some embodiments, the conductive plug 103 is elongated in the width W consistently along the length L. In some embodiments, the length L of the conductive plug 103 is from about 1 um to about 10 um. In some embodiments, the width W of the conductive plug 103 is from about 0.1 um to about 0.5 um.

In some embodiments, the conductive plug 103 has an aspect ratio of the length L to the width W. In some embodiments, the aspect ratio of the conductive plug 103 is substantially greater than 20. In some embodiments, the conductive plug 103 has similar configuration as described above or illustrated in FIG. 1. In some embodiments, a semiconductor structure formed by the method 300 has similar configuration as the semiconductor structure 100 described above or illustrated in FIG. 1.

In the present disclosure, a method of manufacturing a semiconductor structure is also disclosed. In some embodiments, a semiconductor structure 200 is formed by a method 400. The method 400 includes a number of operations and the description and illustration are not deemed as a limitation as the sequence of the operations. The method 400 includes a number of operations (401, 402, 403, 404, 405, 406, 407, 408 and 409).

Figure 4:
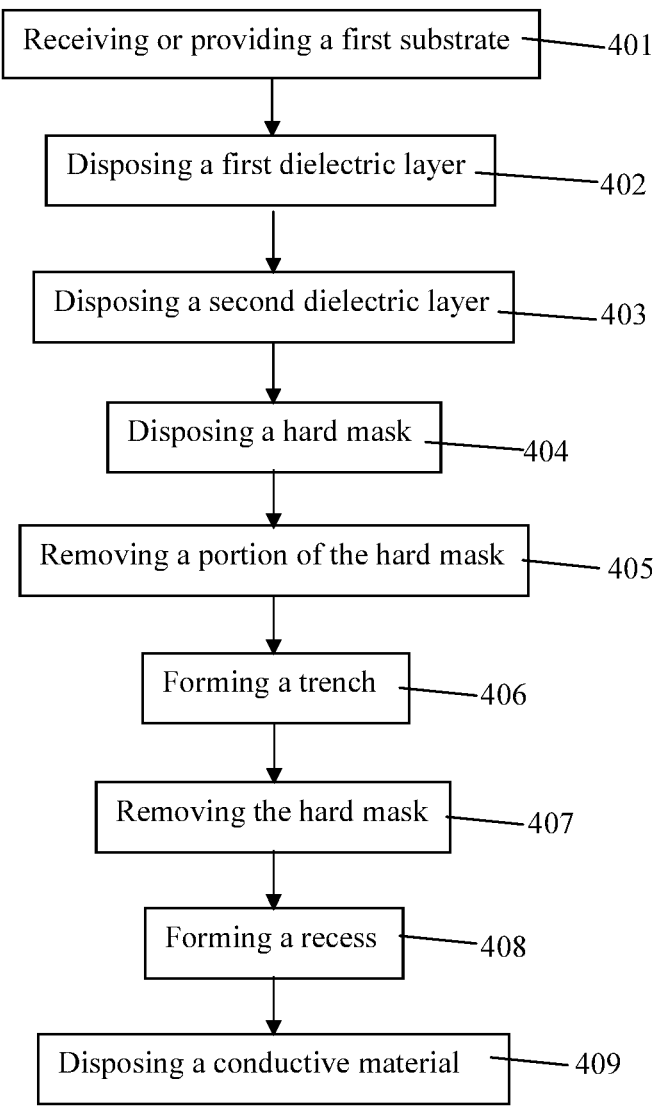
FIG. 4 is a flow diagram of a method of manufacturing a semiconductor structure in accordance with some embodiments of the present disclosure.
Figure 4A:
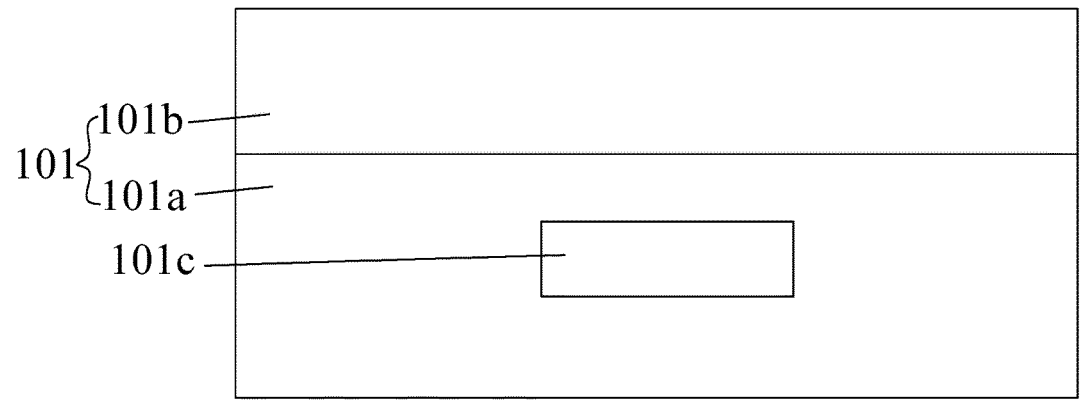
FIGS. 4A-4M are schematic views of manufacturing a semiconductor structure by a method of FIG. 4 in accordance with some embodiments of the present disclosure.
Figure 4B:
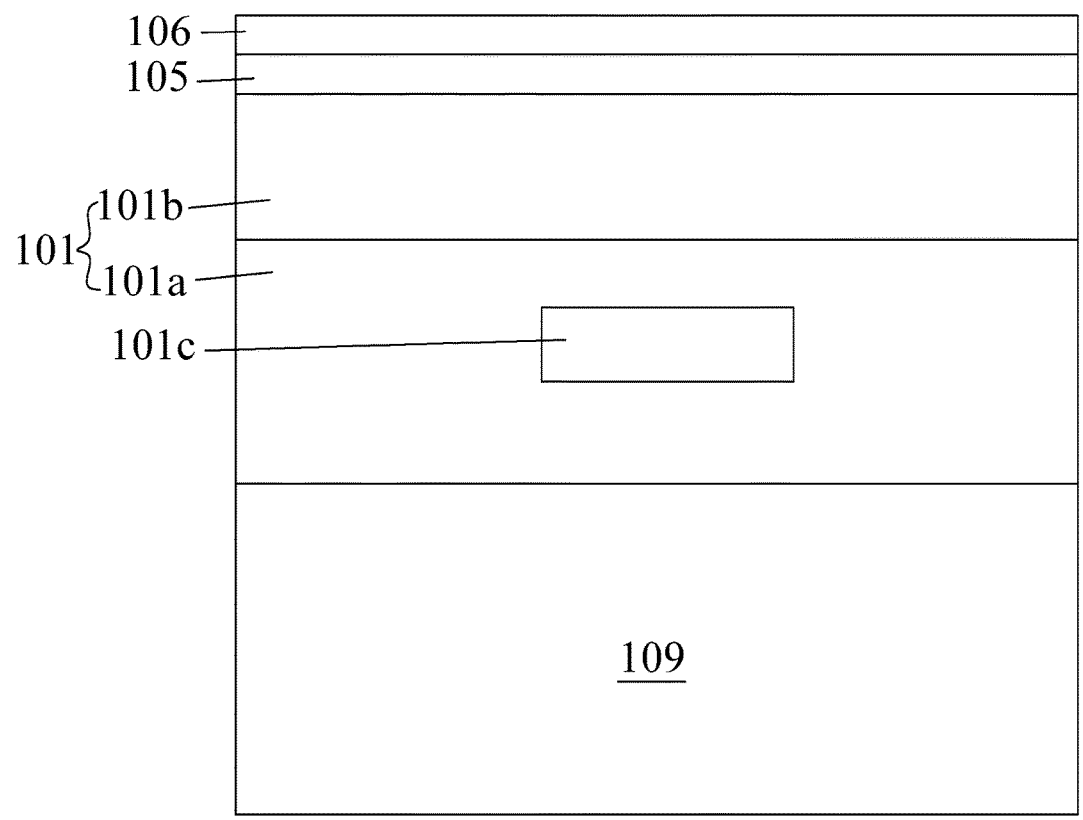

In operation 401, a first substrate 101 is received or provided as shown in FIG. 4A. In some embodiments, the operation 401 is similar to the operation 301. In some embodiments, the first substrate 101 has similar configuration as described above or illustrated in FIG. 2. In some embodiments, the first substrate 101 includes an ILD 101a and a silicon layer 101b disposed over the ILD 101a. In some embodiments, an isolation (105, 106) is disposed over the substrate 101 as shown in FIG. 4B, which is similar to FIG. 3B. In some embodiments, the isolation (105, 106) has similar configuration as described above or illustrated in FIG. 2. In some embodiments, a first nitride 106 is disposed over the first substrate 101. In some embodiments, the first nitride 106 has similar configuration as described above or illustrated in FIG. 2.

In some embodiments, a second substrate 109 is received or provided as shown in FIG. 4B. In some embodiments, the second substrate 109 is bonded with the first substrate 101. In some embodiments, the second substrate 109 has similar configuration as described above or illustrated in FIG. 2. In some embodiments, the second substrate 109 is boned with the first substrate 101 by any suitable operations such as direct bonding, fusion bonding or the like.

Figure 4C:
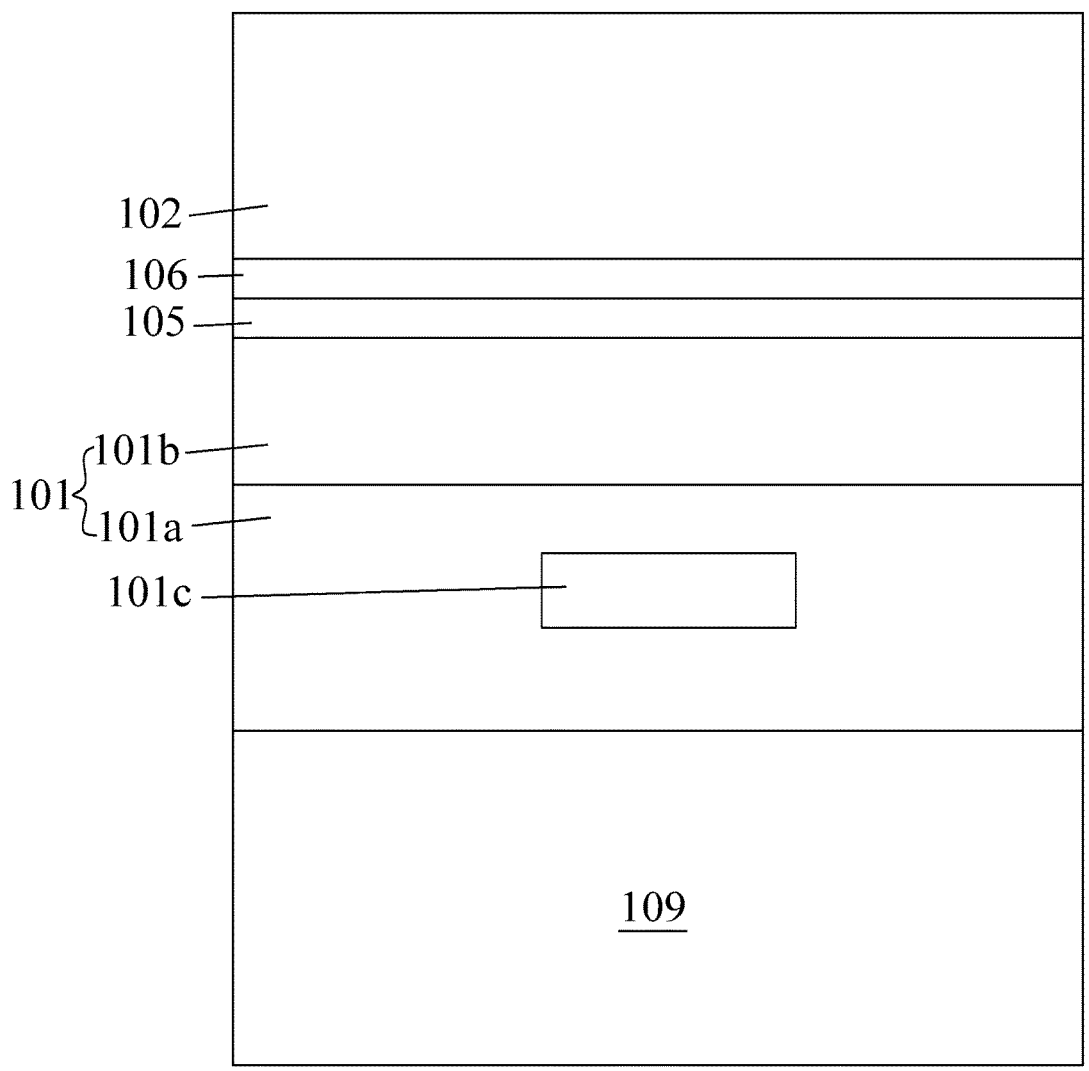

In operation 402, a first dielectric layer 102 is disposed over the first substrate 101 as shown in FIG. 4C. In some embodiments, the first dielectric layer 102 is disposed over the silicon layer 101b. In some embodiments, the operation 402 is similar to the operation 302. In some embodiments, the first dielectric layer 102 has similar configuration as described above or illustrated in FIG. 2.

Figure 4D:
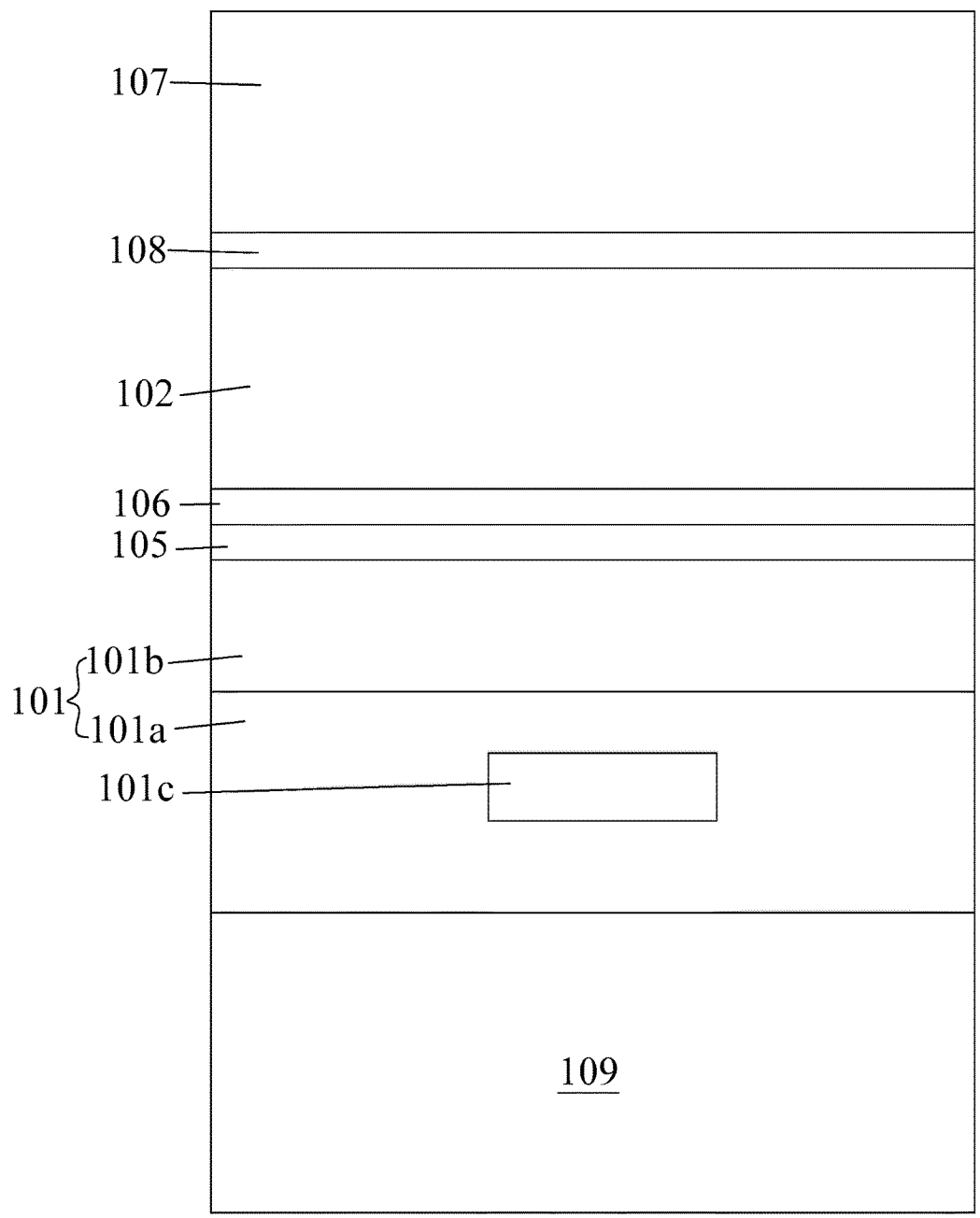

In operation 403, a second dielectric layer 107 is disposed over the first dielectric layer 102 as shown in FIG. 4D. In some embodiments, the second dielectric layer 107 is disposed by spin coating, lamination, chemical vapor deposition (CVD) or any other suitable operations. In some embodiments, the second dielectric layer 107 has similar configuration as described above or illustrated in FIG. 2. In some embodiments, a second nitride 108 is disposed between the first dielectric layer 102 and the second dielectric layer 107. In some embodiments, the second nitride 108 has similar configuration as described above or illustrated in FIG. 2. In some embodiments, the second nitride 108 is disposed by spin coating, lamination, CVD or the like.

Figure 4E:
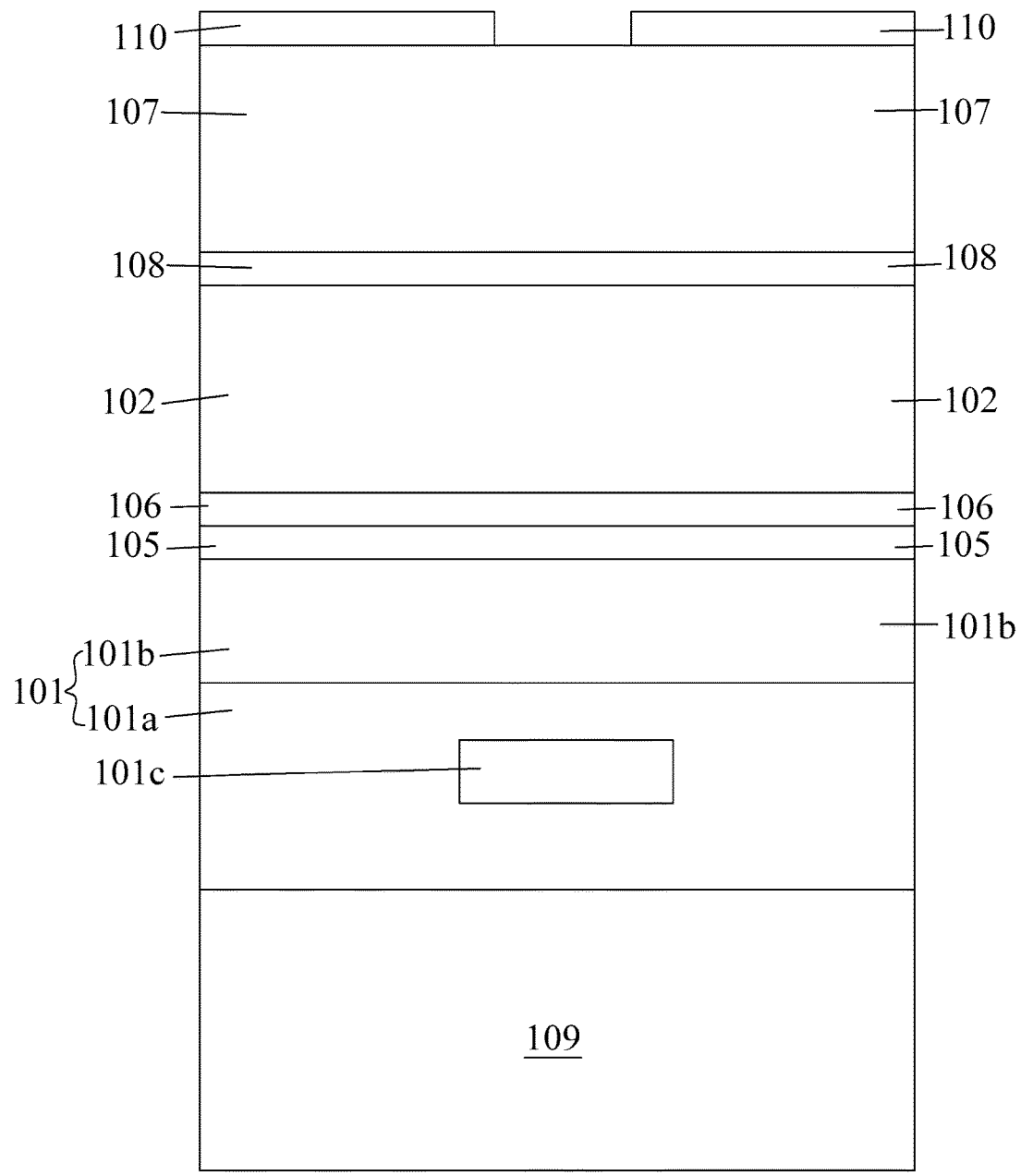

In operation 404, a hard mask 110 is disposed over the second dielectric layer 107 as shown in FIG. 4E. In some embodiments, the hard mask 110 is patterned. In some embodiments, the hard mask 110 is patterned by operations as described above or illustrated in FIGS. 3D-3G. In operation 405, a portion of the hard mask 110 is removed to expose a portion of the second dielectric layer 102 as shown in FIG. 4E, which is similar to FIG. 3G.

Figure 4F:
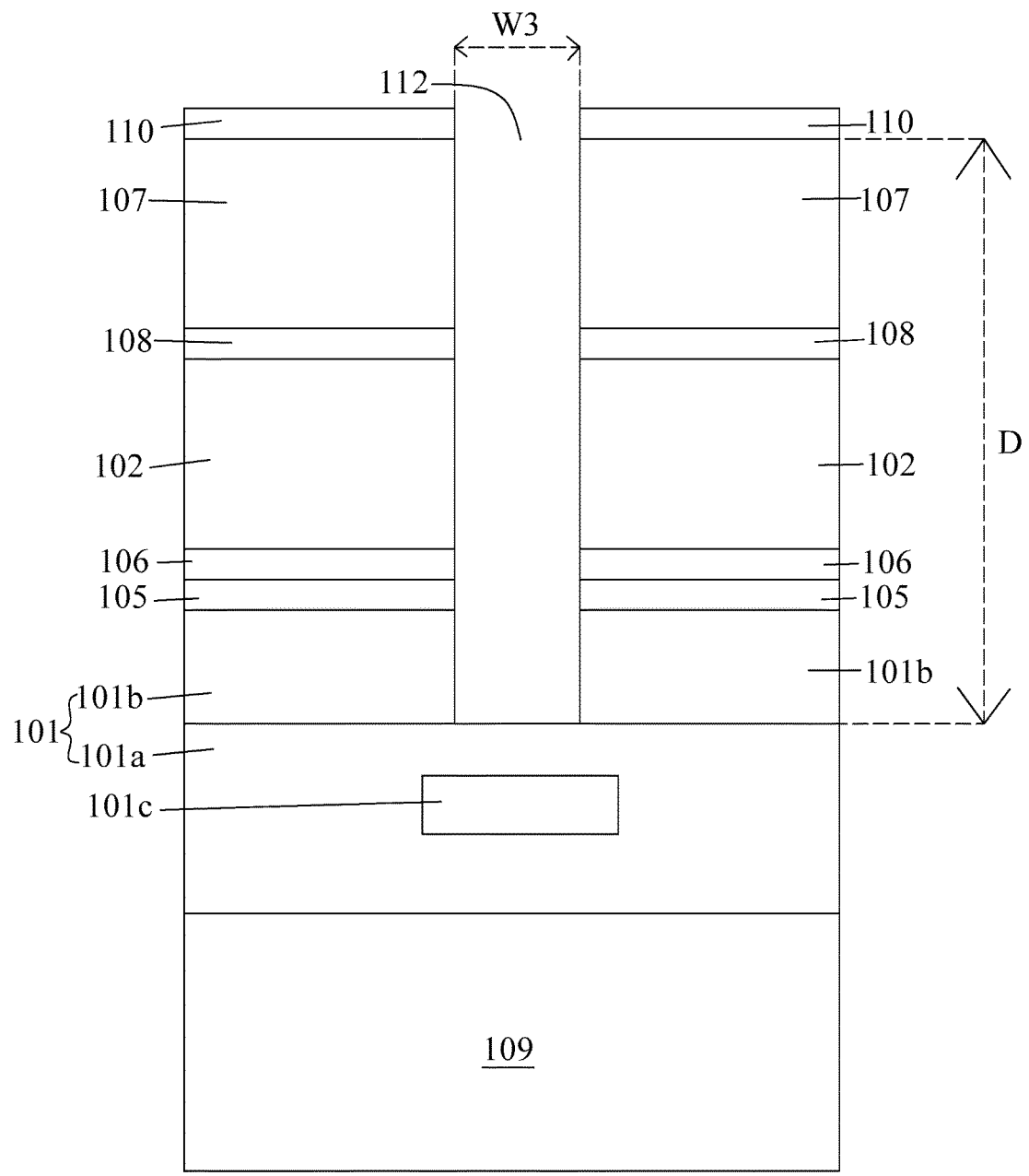

In operation 406, a trench 112 is formed as shown in FIG. 4F. In some embodiments, the trench 112 is extended from the second dielectric layer 107 through the first dielectric layer 102 and the silicon layer 101b to the ILD 101a. In some embodiments, the trench 112 is extended through the second dielectric layer 107, the second nitride 108, the first dielectric layer 102, the first nitride 106, the high-k dielectric 105, the silicon layer 101b and a portion of the ILD 101a. In some embodiments, the trench 112 is formed by removing the second dielectric layer 107, the first dielectric layer 102 and the silicon layer 101b, which are covered by the portion of the dielectric layer 102 exposed from the hard mask 110. In some embodiments, the trench 112 is formed by any suitable operations such as etching.

In some embodiments, the trench 112 has a depth D running from the second dielectric layer 107 to the ILD 101a. In some embodiments, the depth D is from about 1 um to about 10 um. In some embodiments, the trench 112 has a width W3 which is a width of an opening of the trench 112. In some embodiments, the width W3 is from about 0.1 um to about 0.5 um. In some embodiments, the trench 112 has an aspect ratio of the depth D to the width W3. In some embodiments, the aspect ratio of the trench 112 is substantially greater than 30. In some embodiments, the trench 112 has the width W3 substantially consistent along the depth D.

Figure 4G:
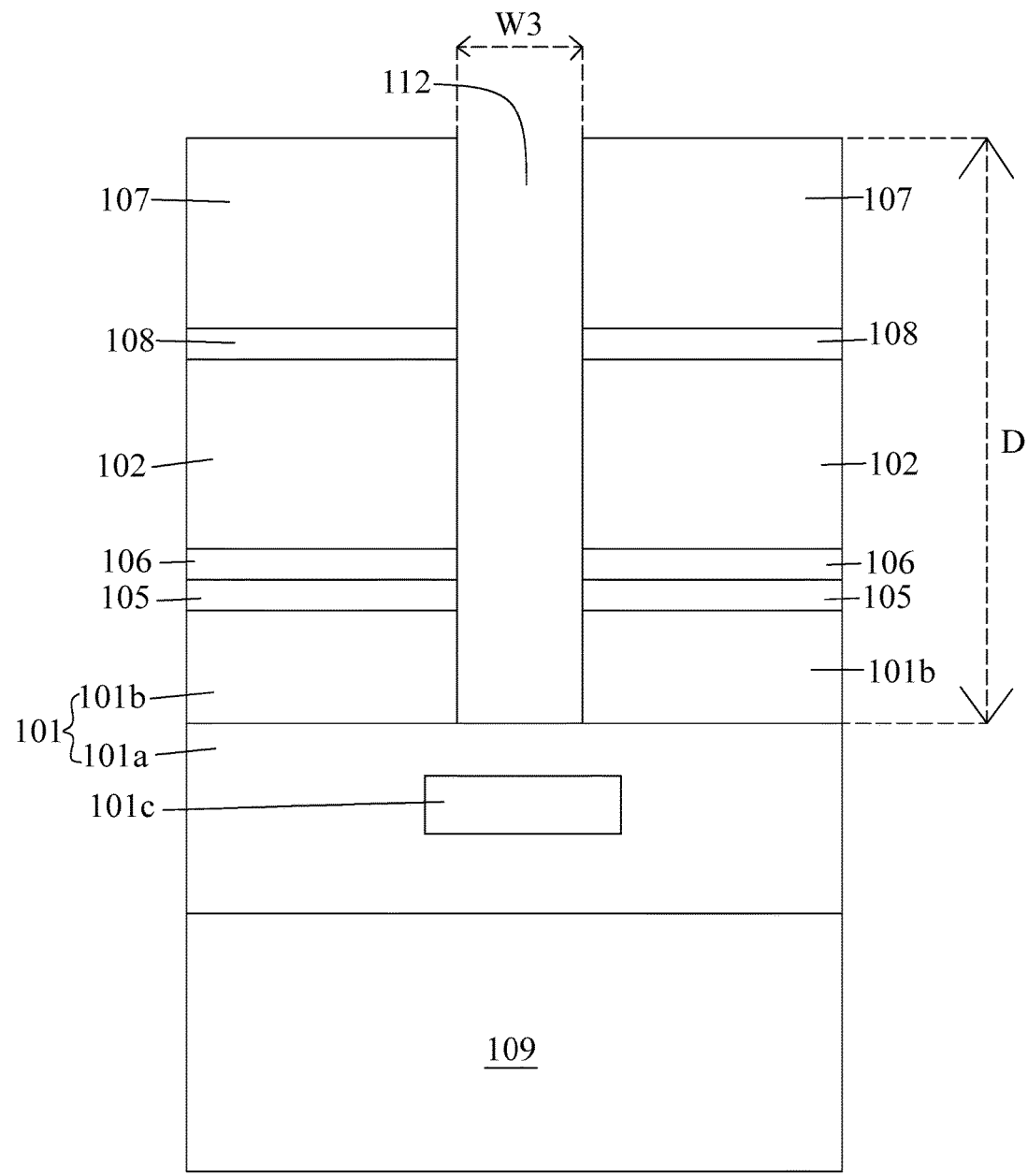

In operation 407, the hard mask 110 is removed from the second dielectric layer 107 as shown in FIG. 4G. In some embodiments, the hard mask 110 is removed after the formation of the trench 112. In some embodiments, the hard mask 110 is removed from the second dielectric layer 107 by any suitable operations such as ashing.

Figure 4H:
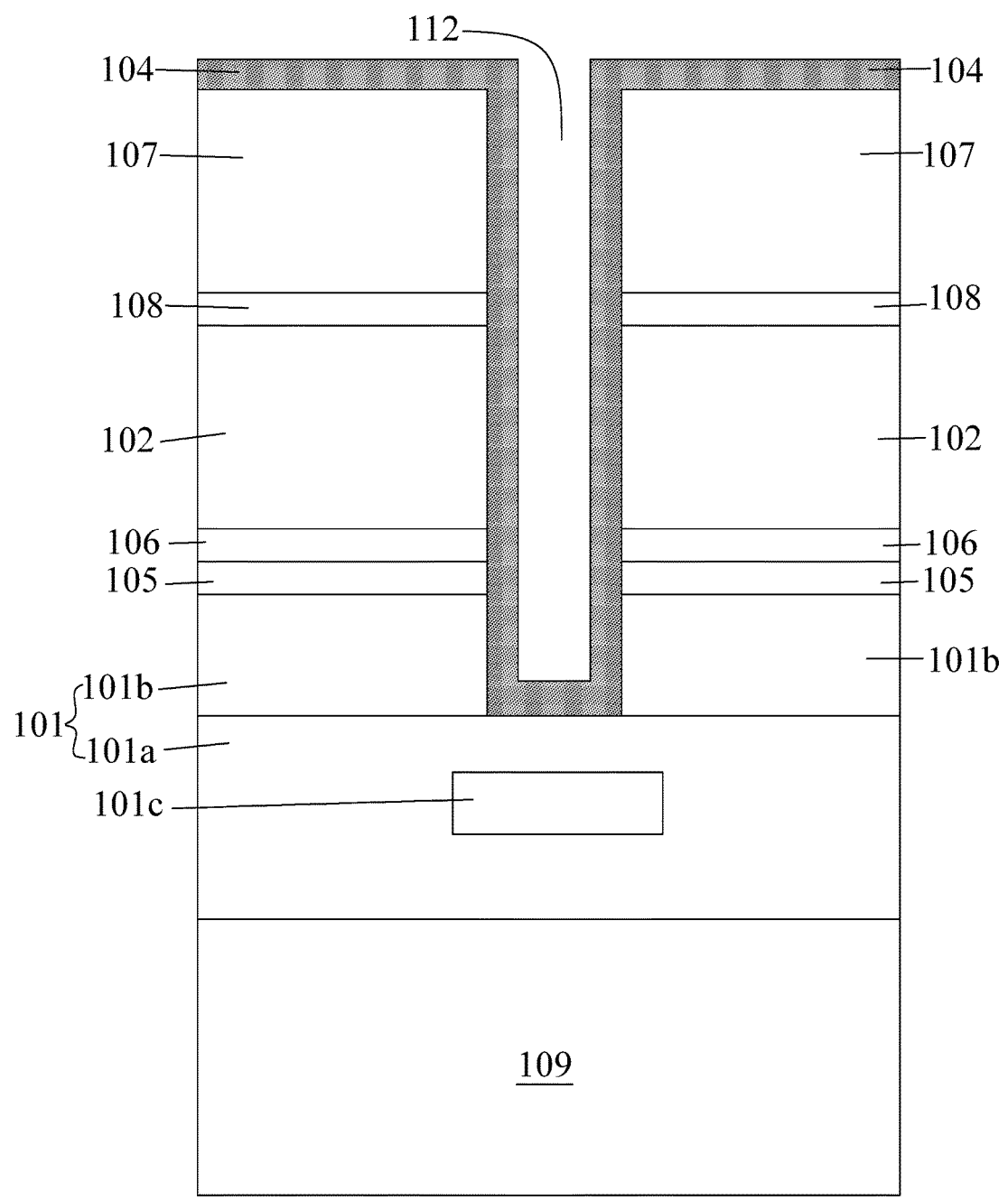

In some embodiments, an isolation layer 104 is disposed over the second dielectric layer 107 and along the trench 112 as shown in FIG. 4H. In some embodiments, the isolation layer 104 is disposed conformal to a sidewall of the trench 112. In some embodiments, the isolation layer 104 is surrounded by the second dielectric layer 107, the first dielectric layer 102 and the silicon layer 101b. In some embodiments, the isolation layer 104 is surrounded by the ILD 101a. In some embodiments, the isolation layer 104 is disposed by any suitable operations such as spin coating, CVD, or etc. In some embodiments, the isolation layer 104 includes nitride, silicon nitride or the like.

Figure 4I:
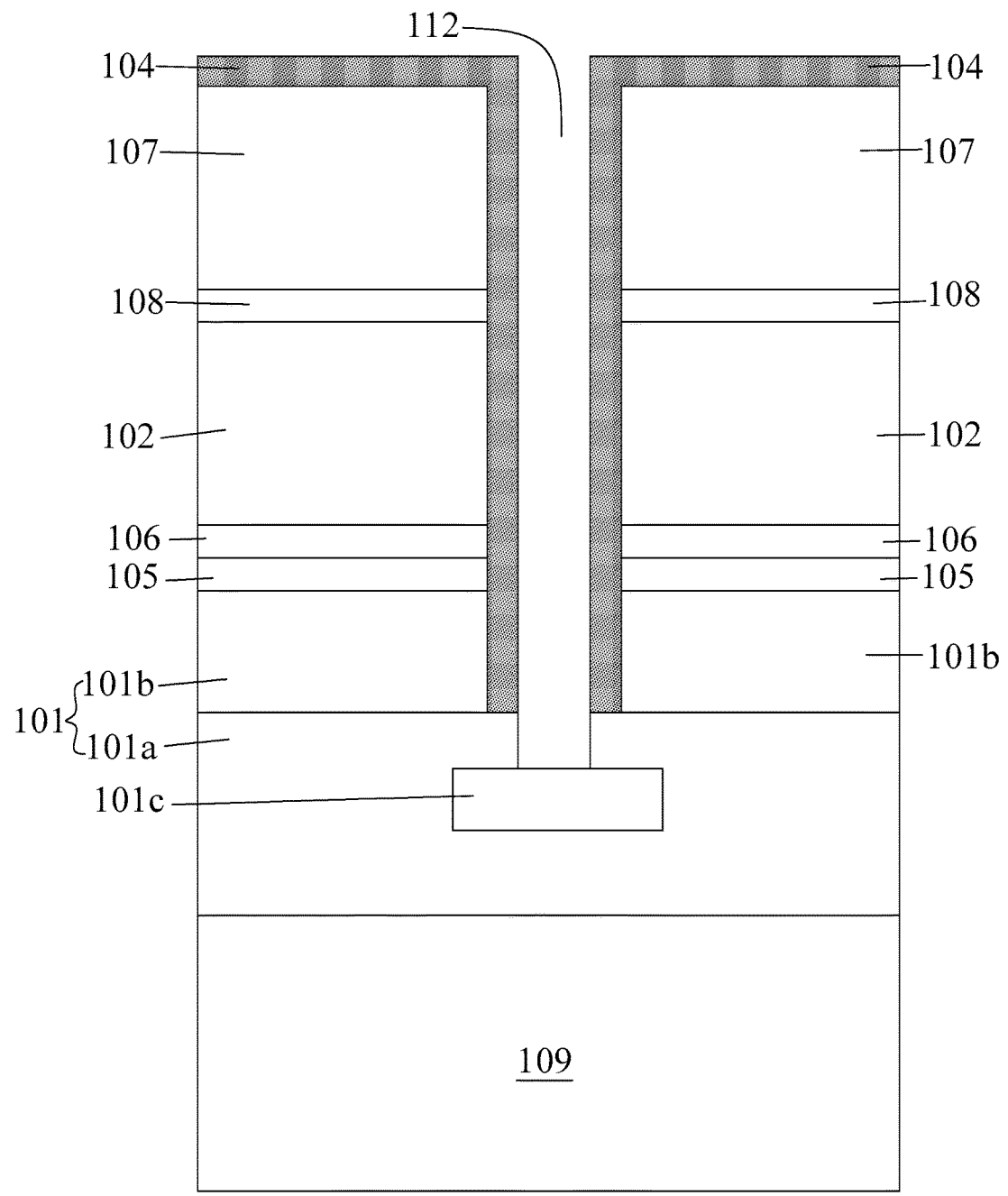

In some embodiments, a portion of the isolation layer 104 disposed over or within the ILD 101a is removed to expose a portion of the ILD 101a as shown in FIG. 4I. In some embodiments, the portion of the ILD 101a exposed from the isolation layer 104 is removed to expose a portion of the conductive structure 101c in the ILD 101a. In some embodiments, the portion of the ILD 101a disposed over the conductive structure 101c is removed. In some embodiments, the portion of the ILD 101a is removed by any suitable operations such as photolithography and etching. In some embodiments, the isolation layer 104 has similar configuration as described above or illustrated in FIG. 2. In some embodiments, the isolation layer 104 disposed over the second dielectric layer 107 is removed after the portion of the conductive structure 101c is exposed from the ILD 101a.

Figure 4J:
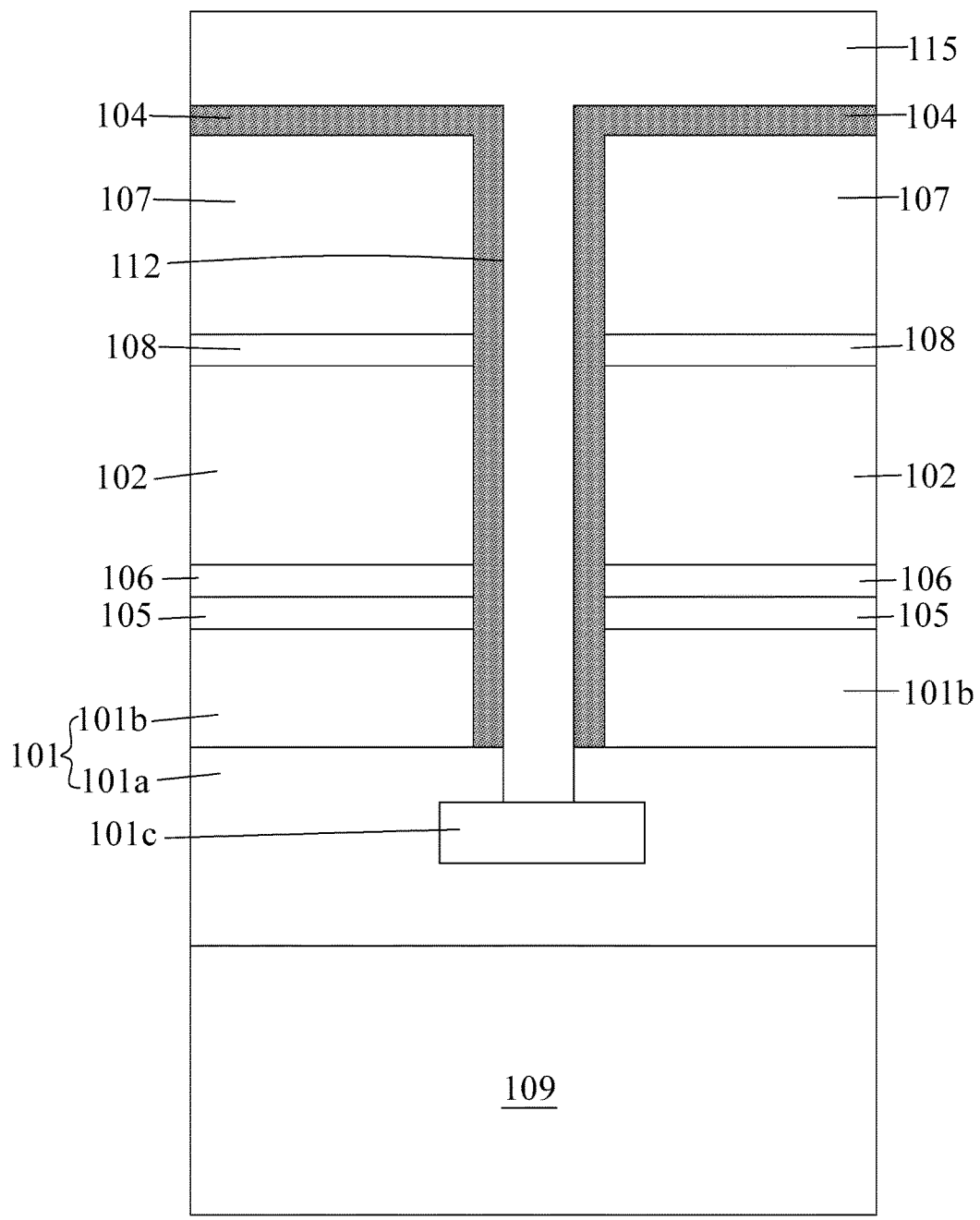
Figure 4K:
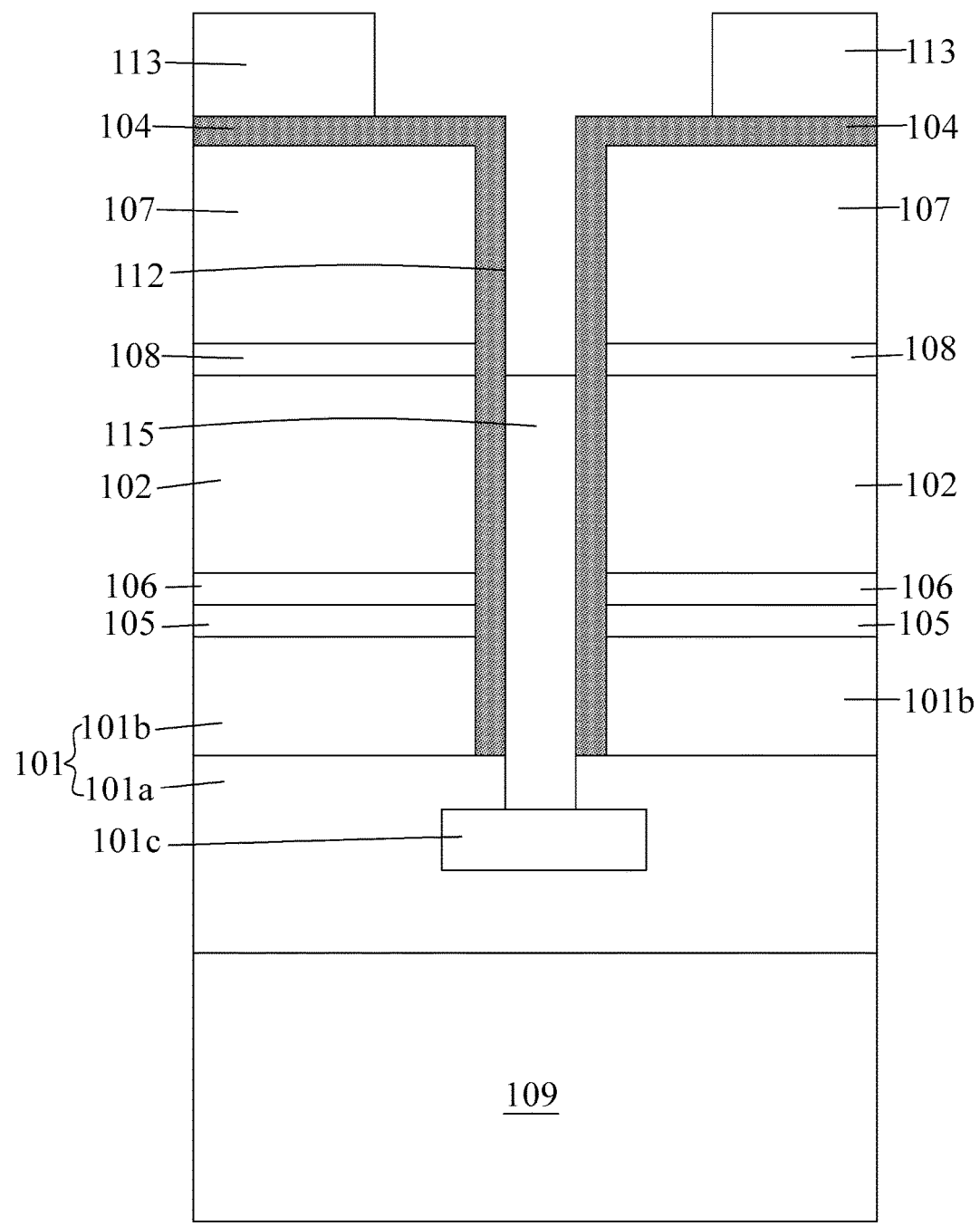

In some embodiments, a photoresist material 115 is disposed over the isolation layer 104 and within the trench 112 as shown in FIG. 4J. In some embodiments, some of the photoresist material 115 are removed, while some of the photoresist material 115 within the trench 112 are remained as shown in FIG. 4K. In some embodiments, the isolation layer 104 contacted with the remained photoresist material 115 is protected by the remained photoresist material 115 and thus would not be removed during later operations. In some embodiments, a photoresist 113 is disposed over the isolation layer 104 or the second dielectric layer 107 as shown in FIG. 4K. In some embodiments, the photoresist 113 is patterned to expose a portion of the isolation layer 104.

Figure 4L:
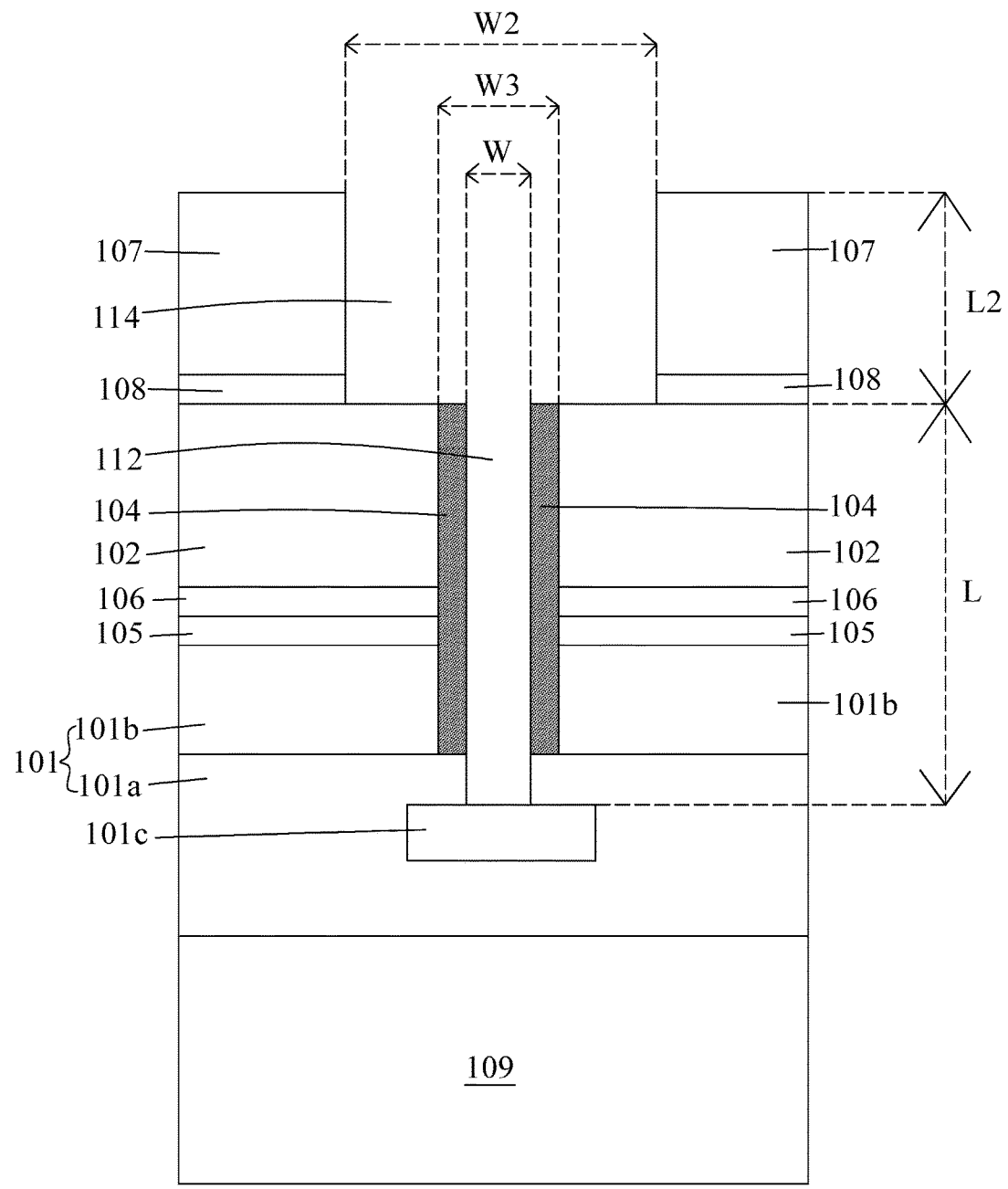

In operation 408, a recess 114 is formed as shown in FIG. 4L. In some embodiments, the recess 114 is extended through the second dielectric layer 107. In some embodiments, the recess 114 is also extended through the second nitride 108. In some embodiments, the recess 114 is extended into a portion of the first dielectric layer 102. In some embodiments, the recess 114 is disposed over the trench 112 extending through the first dielectric layer 102 and the silicon layer 101b. In some embodiments, the recess 114 is coupled with the trench 112.

In some embodiments, the recess 114 is formed by disposing the photoresist 113 over the second dielectric layer 107 and removing a portion of the second dielectric layer 107 exposed from the photoresist 113 or not disposed under the photoresist 113. In some embodiments, the isolation layer 104 without contact with the photoresist material 115 is removed. In some embodiments, the photoresist 113 is patterned to expose the portion of the second dielectric layer 107 or the portion of the isolation layer 104. In some embodiments, the portion of the second dielectric layer 107 and the portion of the isolation layer 104 exposed from the photoresist 113 are removed by any suitable operations such as etching, so as to form the recess 114. In some embodiments, the photoresist 113 is removed from the second dielectric layer 107 after the formation of the recess 114. In some embodiments, the photoresist 113, the isolation layer 104 covered by the photoresist 113 and the photoresist material 115 disposed within the trench 112 are removed after the formation of the recess 114.

In some embodiments, the recess 114 has a width W2 which is substantially greater than the width W3 of the trench 112. In some embodiments, the width W2 is from about 1 um to about 3 um. In some embodiments, the width W2 is from about 1 um to about 1.5 um. In some embodiments, the recess 114 has a length L2 which is substantially smaller than a length L of the trench 112 extending through the first dielectric layer 102 and the silicon layer 101b. In some embodiments, the recess 114 has an aspect ratio of the length L2 to the width W2. In some embodiments, the aspect ratio of the recess 114 is substantially smaller than the aspect ratio of the trench 112 extending through the first dielectric layer 102 and the silicon layer 101b.

Figure 4M:
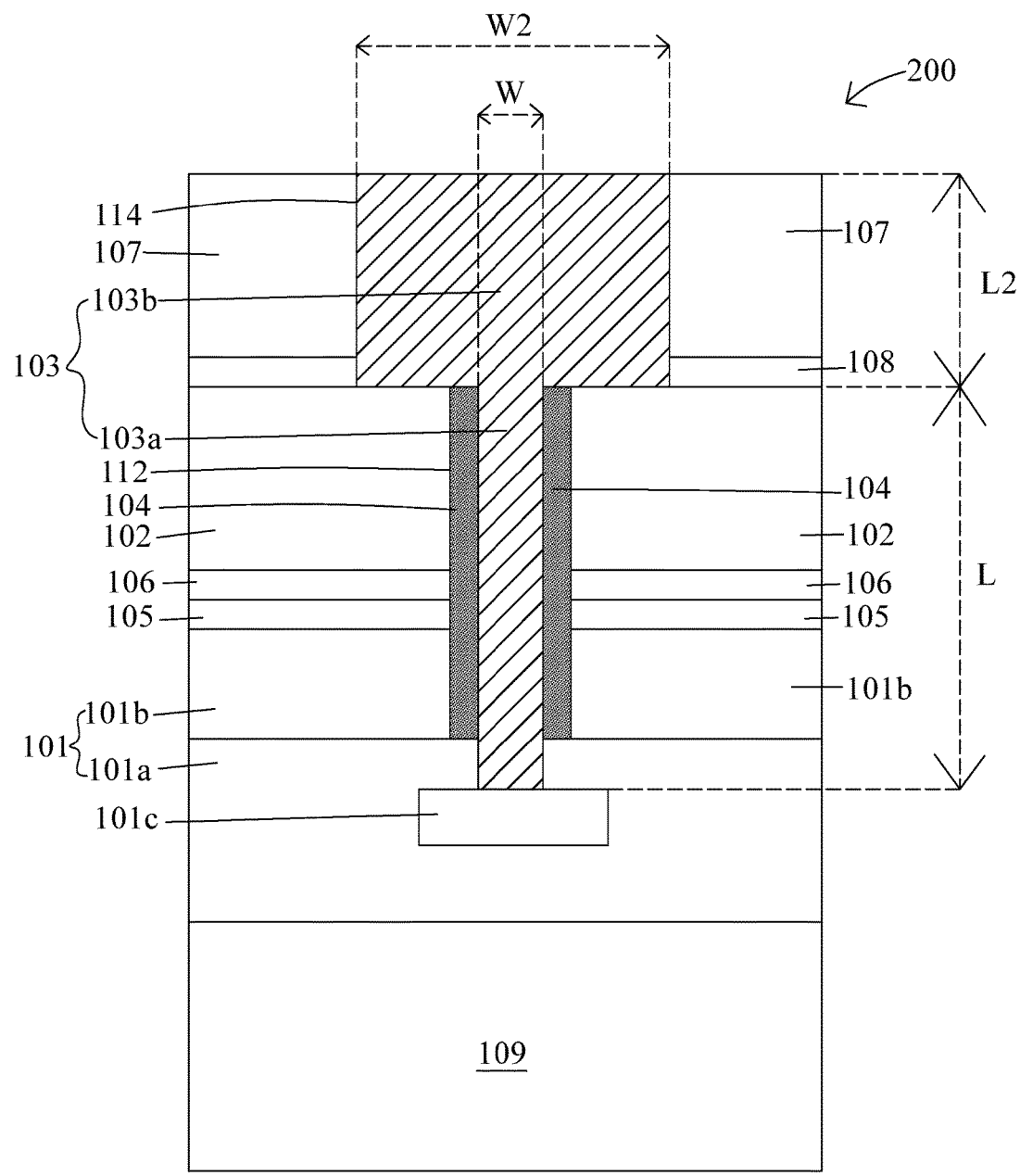

In operation 409, a conductive material is disposed into the trench 112 and the recess 114 to form a conductive plug 103 as shown in FIG. 4M. In some embodiments, the conductive material is disposed to fill the trench 112 and the recess 114. In some embodiments, the conductive material is disposed by any suitable operations such as electroplating or the like. In some embodiments, the conductive material or the conductive plug 103 includes conductive material such as copper, gold, aluminum, nickel, tungsten, palladium, etc.

In some embodiments, the conductive plug 103 includes a first portion 103a and a second portion 103b. In some embodiments, the first portion 103a is extended through the first dielectric layer 102 and the silicon layer 101b. In some embodiments, the first portion 103a is surrounded by the first dielectric layer 102 and the silicon layer 101b. In some embodiments, the second portion 103b is extended through the second dielectric layer 107. In some embodiments, the second portion 103b is surrounded by the second dielectric layer 107. In some embodiments, the second portion 103b is disposed over the first portion 103a. In some embodiments, the first portion 103a is integral with the second portion 103b. In some embodiments, the first portion 103a includes same material as the second portion 103b.

In some embodiments, the first portion 103a has the length L running from the first dielectric layer 102 to the ILD 101a. In some embodiments, the first portion 103a has a width W substantially consistent along the length L. In some embodiments, the length L of the first portion 103a is from about 1 um to about 10 um. In some embodiments, the width W of the first portion 103a is from about 0.1 um to about 0.5 um. In some embodiments, the first portion 103a has an aspect ratio of the length L to the width W. In some embodiments, the aspect ratio of the first portion 103a is substantially greater than about 20. In some embodiments, the first portion 103a has similar configuration as described above or illustrated in FIG. 2.

In some embodiments, the second portion 103b has the width W2 which is substantially greater than the width W of the first portion 103a. In some embodiments, the width W2 is from about 1 um to about 3 um. In some embodiments, the width W2 is from about 1 um to about 1.5 um. In some embodiments, the second portion 103b has the length L2 which is substantially smaller than the length L of the first portion 103a. In some embodiments, the second portion 103b has an aspect ratio of the length L2 to the width W2. In some embodiments, the aspect ratio of the second portion 103b is substantially smaller than the aspect ratio of the first portion 103a. In some embodiments, the second portion 103b has similar configuration as described above or illustrated in FIG. 2. In some embodiments, a semiconductor structure formed by the method 400 has similar configuration as the semiconductor structure 200 described above or illustrated in FIG. 2.

In the present disclosure, an semiconductor structure is disclosed. The semiconductor structure includes a conductive plug extending through a dielectric layer and a silicon layer of a substrate. The conductive plug has a substantially consistent width along its length. Further, the width or critical dimension of the conductive plug is decreased, an aspect ratio of the conductive plug is increased, and a geometric size of the semiconductor structure is reduced.

In some embodiments, a semiconductor structure comprises a substrate comprising an interlayer dielectric (ILD) and a silicon layer disposed over the ILD, wherein the ILD comprises a conductive structure disposed therein, a dielectric layer disposed over the silicon layer, and a conductive plug electrically connected with the conductive structure and extended from the dielectric layer through the silicon layer to the ILD, wherein the conductive plug has a length running from the dielectric layer to the ILD and a width substantially consistent along the length.

In some embodiments, the conductive plug is surrounded by the dielectric layer, the silicon layer and the ILD. In some embodiments, the conductive plug is coupled with the conductive structure. In some embodiments, the width is from about 0.1 um to about 0.5 um, or the length is from about 1 um to about 10 um. In some embodiments, the conductive plug has an aspect ratio of the length to the width, and the aspect ratio is substantially greater than about 20. In some embodiments, the dielectric layer comprises an undoped silica glass (USG). In some embodiments, the semiconductor structure further comprises an isolation layer surrounding the conductive plug to insulate the conductive plug from the dielectric layer and the silicon layer. In some embodiments, the semiconductor structure further comprises a second substrate bonded with the ILD of the substrate.

In some embodiments, a method of manufacturing a semiconductor structure comprises providing a substrate comprising an interlayer dielectric (ILD) and a silicon layer disposed over the ILD, disposing a dielectric layer over the silicon layer, disposing a hard mask over the dielectric layer, forming a trench extending from a portion of the dielectric layer exposed from the hard mark to the ILD, and disposing a conductive material into the trench to form a conductive plug, wherein the conductive plug is extended from the dielectric layer through the silicon layer to the ILD, and the conductive plug has a length running from the dielectric layer to the ILD and a width substantially consistent along the length.

In some embodiments, the disposing the hard mask comprises disposing a photoresist over the hard mask, removing a portion of the hard mask exposed from the photoresist, and removing the photoresist from the hard mask. In some embodiments, the forming the trench comprises removing the dielectric layer and the silicon layer which are covered by the portion of the dielectric layer exposed from the hard mask. In some embodiments, the trench has a depth running from the dielectric layer to the ILD, and has a width substantially consistent along the depth. In some embodiments, the trench has a depth of from about 1 um to about 10 um running from the dielectric layer to the ILD, or the trench has a width of from about 0.1 um to about 0.5 um, or the trench has an aspect ratio of the depth to the width of the trench and the aspect ratio is substantially greater than 30. In some embodiments, the method further comprises removing the hard mask from the dielectric layer, or wherein the hard mask is an oxide layer. In some embodiments, the method further comprises disposing an isolation layer conformal to a sidewall of the trench.

In some embodiments, a method of manufacturing a semiconductor structure comprises providing a substrate comprising an interlayer dielectric (ILD) and a silicon layer disposed over the ILD layer, disposing a first dielectric layer over the silicon layer, disposing a second dielectric layer over the first dielectric layer, disposing a hard mask over the second dielectric layer, removing a portion of the hard mask to expose a portion of the second dielectric layer, forming a trench extending from the portion of the second dielectric layer to the ILD, removing the hard mask from the second dielectric layer, forming a recess extending through the second dielectric layer, and disposing a conductive material into the trench and the recess to form a conductive plug, wherein the conductive plug comprises a first portion extending through the first dielectric layer and the silicon layer, and a second portion extending through the second dielectric layer, and wherein the first portion of the conductive plug has a length running from the first dielectric layer to the ILD and a width substantially consistent along the length.

In some embodiments, the first portion of the conductive plug is surrounded by the first dielectric layer and the silicon layer, and the second portion of the conductive plug is surrounded by the second dielectric layer. In some embodiments, the recess is disposed over the trench, or the recess is coupled with the trench. In some embodiments, the recess has a width substantially greater than a width of the trench, or the width of the recess is from about 1 um to about 3 um. In some embodiments, the forming the recess comprises disposing a photoresist over the second dielectric layer and removing a portion of the second dielectric layer exposed from the photoresist.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method of manufacturing a semiconductor structure, comprising:
    providing a substrate comprising an interlayer dielectric (ILD), a silicon layer disposed over the ILD and a conductive structure disposed within the ILD;
    disposing a dielectric layer over the silicon layer;
    disposing a hard mask over the dielectric layer;
    removing a portion of the dielectric layer and a portion of the silicon layer to form a trench, wherein the ILD is exposed from a bottom of the trench;
    disposing an isolation layer over sidewalls and the bottom of the trench;
    removing a portion of the isolation layer and a portion of the ILD to expose the conductive structure; and
    disposing a conductive material into the trench to form a conductive plug, wherein the conductive plug is in contact with the isolation layer, the ILD layer and the conductive structure, the conductive plug is extended through the dielectric layer and the silicon layer to the ILD, and the conductive plug has a length running from the dielectric layer to the ILD and a width substantially consistent along the length.

2. The method of claim 1, wherein the disposing the hard mask comprises disposing a photoresist over the hard mask, removing a portion of the hard mask exposed from the photoresist, and removing the photoresist from the hard mask.

3. The method of claim 1, wherein the conductive plug is surrounded by the dielectric layer, the silicon layer and the ILD.

4. The method of claim 1, wherein the trench has a depth running from the dielectric layer to the ILD, and has a width substantially consistent along the depth.

5. The method of claim 1, wherein the trench has a depth of from about 1 um to about 10 um running from the dielectric layer to the ILD, or the trench has a width of from about 0.1 um to about 0.5 um, or the trench has an aspect ratio of the depth to the width of the trench and the aspect ratio is substantially greater than 30.

6. The method of claim 1, further comprising removing the hard mask from the dielectric layer, or wherein the hard mask is an oxide layer.

7. The method of claim 1, wherein the isolation layer is conformal to the sidewall of the trench.

8. A method of manufacturing a semiconductor structure, comprising:
    providing an interlayer dielectric (ILD) including a conductive structure within the ILD;
    disposing a silicon layer over the ILD;
    disposing a first isolation layer over the silicon layer;
    disposing a second isolation layer over the first isolation layer;
    disposing a dielectric layer over the second isolation layer;
    disposing and patterning a hard mask over the dielectric layer;
    removing a portion of the dielectric layer, a portion of the first isolation layer, a portion of the second isolation layer and a portion of the silicon layer to form a trench;
    removing the hard mask;
    disposing a third isolation layer conformal to a sidewall of the trench;
    removing a portion of the ILD to expose a portion of the conductive structure, and
    disposing a conductive material to form a conductive plug surrounded by the third isolation layer and electrically connected to conductive structure.

9. The method of claim 8, wherein the conductive plug is extended from the conductive structure to the dielectric layer.

10. The method of claim 8, wherein the patterning the hard mask includes disposing a photoresist over the hard mask and removing a portion of the hard mask exposed from the photoresist.

11. The method of claim 8, wherein the disposing the third isolation layer includes spin coating operations or CVD operations.

12. The method of claim 8, wherein the third isolation layer is disposed over the dielectric layer.

13. The method of claim 8, wherein the first isolation layer includes high-k dielectric.

14. The method of claim 8, wherein the second isolation layer includes nitride.

15. The method of claim 8, wherein the dielectric layer includes undoped silica glass (USG).

16. The method of claim 8, wherein the conductive plug includes copper, nickel, gold or palladium.

17. A method of manufacturing a semiconductor structure, comprising:
    providing a substrate comprising an interlayer dielectric (ILD) and a silicon layer disposed over the ILD;
    disposing a dielectric layer over the silicon layer;
    removing a portion of the dielectric layer, a portion of the silicon layer and a portion of the ILD to form a trench;
    disposing an isolation layer over a portion of sidewalls of the trench; and
    disposing a conductive material into the trench to form a conductive plug extending through the dielectric layer and the silicon layer to the ILD, wherein the ILD is exposed by a portion of the sidewalls of the trench, the conductive plug is spaced apart and electrically isolated from the silicon layer by the isolation layer, and the conductive plug is in contact with the ILD and the isolation layer.

18. The method of claim 17, wherein the conductive plug is electrically coupled with a conductive structure disposed within the ILD.

19. The method of claim 17, wherein the removal of the portion of the dielectric layer is prior to the removal of the portion of the silicon layer, and the removal of the portion of the silicon layer is prior to the removal of the portion of the ILD.

20. The method of claim 17, wherein a width of the portion of the dielectric layer is substantially same as a width of the portion of the silicon layer.

* * * * *